(12) United States Patent
Lee et al.

(10) Patent No.: US 8,821,642 B2
(45) Date of Patent: Sep. 2, 2014

(54) APPARATUS FOR MANUFACTURING FLAT-PANEL DISPLAY

(75) Inventors: Young Jong Lee, Sungnam-shi (KR); Jun Young Choi, Seoul (KR); Saeng Hyun Jo, Daejeon (KR); Hyun Hwan Ahn, Sungnam-shi (KR); Suk-Min Son, Daejeon (KR); Sung Il Ahn, ChungCheongNam-do (KR)

(73) Assignee: Advanced Display Process Engineering Co., Ltd., Sungnam-Shi, Kyunggi-Do (KR)

( * ) Notice: Subject to any disclaimer, the term of this patent is extended or adjusted under 35 U.S.C. 154(b) by 759 days.

(21) Appl. No.: 12/324,202

(22) Filed: Nov. 26, 2008

(65) Prior Publication Data

US 2009/0078373 A1    Mar. 26, 2009

Related U.S. Application Data

(62) Division of application No. 11/239,398, filed on Sep. 29, 2005.

(30) Foreign Application Priority Data

| Oct. 6, 2004 | (KR) | 10-2004-0079416 |
| Oct. 20, 2004 | (KR) | 10-2004-0083843 |
| Nov. 17, 2004 | (KR) | 10-2004-0094230 |
| Dec. 8, 2004 | (KR) | 10-2004-00102975 |
| Dec. 24, 2004 | (KR) | 10-2004-0111693 |

(51) Int. Cl.
*C23C 16/00* (2006.01)
*C23F 1/00* (2006.01)

(52) U.S. Cl.
USPC .......... 118/733; 118/50; 156/345.1; 277/345; 277/913; 220/233; 220/239

(58) Field of Classification Search
USPC .......... 118/733, 50; 156/345.1; 277/628, 637, 277/646, 913, 345; 220/233, 239, 378
See application file for complete search history.

(56) References Cited

U.S. PATENT DOCUMENTS 3,940,152 A * 2/1976 Fournier ...................... 277/641
5,238,164 A   8/1993 Freeman
(Continued)

FOREIGN PATENT DOCUMENTS

JP    11-117067    4/1999

OTHER PUBLICATIONS

Office Action issued in U.S. Appl. No. 12/324,256 dated Dec. 3, 2009.

(Continued)

*Primary Examiner* — Karla Moore
(74) *Attorney, Agent, or Firm* — KED & Associates, LLP

(57) ABSTRACT

Disclosed herein is a flat panel display (FPD) manufacturing apparatus for performing a desired process for a substrate positioned in a chamber after establishing a vacuum atmosphere in the chamber. The vacuum chamber is divided into a chamber body and an upper cover to ensure easy opening/closing operations of the upper cover.

10 Claims, 19 Drawing Sheets

(56) References Cited

U.S. PATENT DOCUMENTS

| | | | |
|---|---|---|---|
| 5,368,648 A | | 11/1994 | Sekizuka |
| 5,529,673 A | * | 6/1996 | Strauss et al. ............. 204/298.12 |
| 6,035,804 A | * | 3/2000 | Arami et al. ............... 118/723 E |
| 6,565,662 B2 | | 5/2003 | Amano et al. |
| 6,719,848 B2 | | 4/2004 | Faykosh et al. |
| 7,682,454 B2 | | 3/2010 | Sneh |
| 7,879,181 B2 | | 2/2011 | Lee et al. |
| 2003/0033982 A1 | | 2/2003 | Faykosh et al. |
| 2006/0071384 A1 | | 4/2006 | Lee et al. |
| 2009/0078373 A1 | | 3/2009 | Lee et al. |

OTHER PUBLICATIONS

Office Action issued in U.S. Appl. No. 11/239,398 dated Feb. 18, 2010.

U.S. Office Action dated Sep. 22, 2009.

U.S. Office Action issued in U.S. Appl. No. 12/324,297 dated Mar. 17, 2010.

Final Office Action issued in U.S. Appl. No. 11/239,398 dated Apr. 13, 2011.

U.S. Office Action issued in U.S. Appl. No. 12/324,297 dated Dec. 9, 2013.

* cited by examiner

APPARATUS FOR MANUFACTURING FLAT-PANEL DISPLAY

CROSS-REFERENCE TO RELATED APPLICATIONS

This application is a Divisional application of prior U.S. patent application Ser. No. 11/239,398 filed Sep. 29, 2005, which claims priority under 35 U.S.C. §119 to Korean Application Nos. 79416/2004 filed on Oct. 6, 2004; 83843/2004 filed on Oct. 20, 2004; 94230/2004 filed on Nov. 17, 2004; 102975/2004 filed on Dec. 8, 2004 and 111693/2004 filed on Dec. 24, 2004, whose entire disclosures are hereby incorporated by reference.

BACKGROUND OF THE INVENTION

1. Field of the Invention

The present invention relates to an apparatus for manufacturing a flat-panel display (FPD), which can perform a desired process for an FPD substrate after establishing a vacuum atmosphere therein, and, more particularly, to an FPD manufacturing apparatus in which a vacuum chamber is divided into a chamber body and an upper cover, whereby the upper cover can be easily opened and closed.

2. Description of the Related Art

Flat-panel display (FPD) manufacturing apparatuses are designed to feed an FPD substrate thereinto and to perform a desired process, such as an etching process, for the FPD substrate by use of plasma, etc. Examples of FPDs include LCDs, PDPs, OLEDs, etc. Among such FPD manufacturing apparatuses, a general vacuum processing apparatus comprises three vacuum chambers including a load lock chamber, a transfer chamber, and a processing chamber.

The load lock chamber is used to receive a substrate, which will be processed in the FPD manufacturing apparatus, from an external station for loading the substrate or to discharge a substrate completely processed in the FPD manufacturing apparatus for unloading the substrate. The transfer chamber is provided with a robot for feeding a substrate between respective chambers, so that it conveys the substrate, which will be processed, from the load lock chamber to the processing chamber or conveys the substrate, which was completely processed, from the processing chamber to the load lock chamber. The processing chamber is used to perform a film deposition process or etching process for a substrate by use of plasma or thermal energy under a vacuum atmosphere.

Due to the fact that a variety of gases or plasma is used in the processing chamber, equipment provided in the processing chamber may be damaged or polluted if a great number of processes are repeated and, thus, it is necessary to periodically exchange or repair the equipment. For this reason, as shown in FIG. 1, the processing chamber, designated by reference numeral 1, generally consists of a chamber body 10 and an upper cover 20, so that the upper cover 20 of the processing chamber 1 can be opened and closed for the maintenance and repair of the chamber interior. To open and close the upper cover 20, conventionally, a crane has been mounted to the top of a clean room in which the processing chamber 1 is provided, so that the upper cover 20 is opened and closed by use of the crane. Alternatively, the processing chamber is equipped with opening/closing means to open and close the upper cover.

Referring to FIG. 2, an example of the conventional opening/closing means for the upper cover 20 is illustrated. As shown in FIG. 2, the upper cover opening/closing means 50 is provided at the outside of the processing chamber 1 to open and close the upper cover 20. The opening/closing means 50 includes a vertical drive unit to vertically lift the upper cover 20, a horizontal drive unit to horizontally move the upper cover 20, and a rotating unit to rotate the upper cover 20. Additionally, the opening/closing means 50 is provided with a horizontal movement guide 60 to provide a movement path of the horizontal drive unit.

Hereinafter, the opening/closing procedure of the upper cover 20 carried out by the opening/closing means 50 having the above configuration will be explained. First, the upper cover 20 is lifted vertically by a predetermined height by use of the vertical drive unit included in the opening/closing means 50. In succession, the upper cover 20 is horizontally moved along the horizontal movement guide 60 in a state of being lifted. After completing such a horizontal movement, the upper cover 20 is rotated by 180° by use of the rotating unit. As a result, both the chamber body 10 and the upper cover 20 of the processing chamber 1 are opened to enable exchange or repair of respective equipment provided in the processing chamber 1.

However, the size of a substrate to be processed by the FDP manufacturing apparatus has been recently increased, and accordingly, the size of vacuum chambers included in the FDP manufacturing apparatus is rapidly increasing. For example, in the case of a current available vacuum chamber, an upper cover thereof not only has a large size of 3 by 4 meters, but also has a heavy weight of more than 3 to 4 tons. Therefore, in order to vertically lift the large-size heavy upper cover of the vacuum chamber, it is necessary to provide the vertical drive unit with an air cylinder having an extremely high capacity. Furthermore, the bulky upper cover exhibits an increase in the lack of stability when it is vertically lifted, adversely affecting maintenance and repair in the interior of the vacuum chamber.

SUMMARY OF THE INVENTION

Therefore, the present invention has been made in view of the above problems, and it is an object of the present invention to provide an FPD manufacturing apparatus capable of easily opening/closing an upper cover.

In accordance with a first aspect of the present invention, the above and other objects can be accomplished by the provision of an FPD manufacturing apparatus comprising: a vacuum chamber including a chamber body and an upper cover located at an upper side of the chamber body to face the chamber body, the chamber body being spaced apart from the chamber body by a predetermined distance; sealing means separably coupled to the upper cover to seal rims of the chamber body and the upper cover; a pair of rotating units coupled to corresponding positions of opposite lateral surfaces of the upper cover and adapted to rotate the upper cover; a pair of horizontal drive units coupled to the rotating units, respectively, and adapted to support the upper cover coupled to the rotating units and to horizontally move the upper cover; track units coupled to the horizontal drive units, respectively, to provide a movement path of the horizontal drive units; and one or more processor units provided in the vacuum chamber to perform a desired process for an object loaded in the vacuum chamber.

In accordance with a second aspect of the present invention, the above and other objects can be accomplished by the provision of an FPD manufacturing apparatus for performing a desired process for a substrate loaded into a chamber under a vacuum atmosphere after generating plasma in the chamber, wherein: the chamber includes: a lower chamber; and an upper chamber disposed on the lower chamber to be opened away from or closed to the lower chamber, coupling surfaces of the lower and upper chambers being inclined downwardly in a movement direction of the upper chamber; and the FPD manufacturing apparatus comprises: a pair of horizontal drive units to support the upper chamber in a horizontally movable manner; and a pair of rotating units to rotatably support the upper chamber.

In accordance with a third aspect of the present invention, the above and other objects can be accomplished by the provision of an upper cover opening/closing device for use in an FPD manufacturing apparatus that performs a desired process for a substrate loaded into a vacuum chamber, comprising: a cover loading unit to support and rotate an upper cover separated from the vacuum chamber; and a track unit to provide a movement path for moving the cover loading unit to a location close to the vacuum chamber, wherein a movable block is provided at a portion of the cover loading unit to be coupled with the track unit, to allow the cover loading unit to move along the track unit in a state of being seated on the track unit.

In accordance with a fourth aspect of the present invention, the above and other objects can be accomplished by the provision of an upper cover opening/closing device for opening/closing an upper cover provided on a vacuum chamber of an FPD manufacturing apparatus that performs a desired process for a substrate loaded into the vacuum chamber, comprising: a linkage independent of the upper cover, the linkage being coupled to the upper cover to pivotally rotate the upper cover along a parabolic orbit, to be opened away from or closed to the vacuum chamber.

In accordance with a fifth aspect of the present invention, the above and other objects can be accomplished by the provision of an FPD manufacturing apparatus for performing a desired process for a substrate loaded into a chamber under a vacuum atmosphere comprising: a transfer chamber provided therein with a transfer robot to load or unload a substrate to or from a load lock chamber or processing chamber, a separable upper cover being provided on an upper end of the transfer chamber to move the transfer robot to an external station; and a pair of horizontal drive units provided at opposite sides of the transfer chamber to support the upper cover in a horizontally movable manner.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, exemplary embodiments of the present invention will be explained with reference to the accompanying drawings.

First Embodiment

Figure 1:
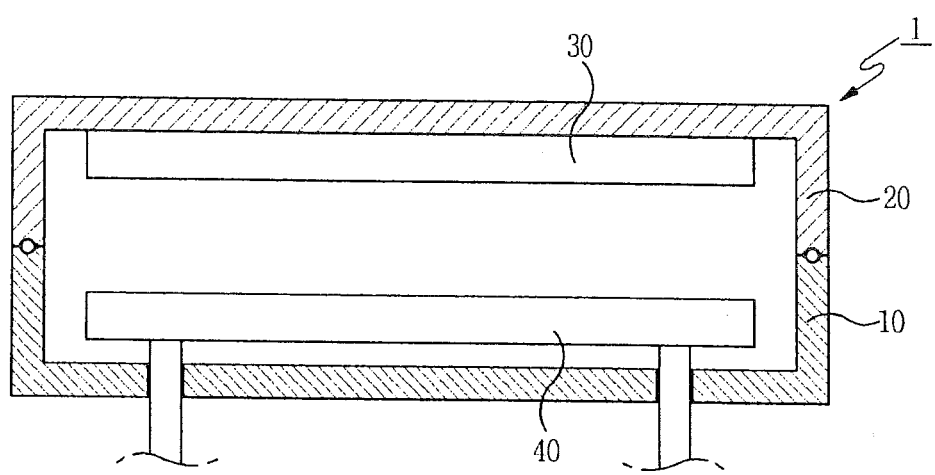
FIG. 1 is a sectional view illustrating the structure of a processing chamber provided in a prior art FPD manufacturing apparatus.
Figure 2:
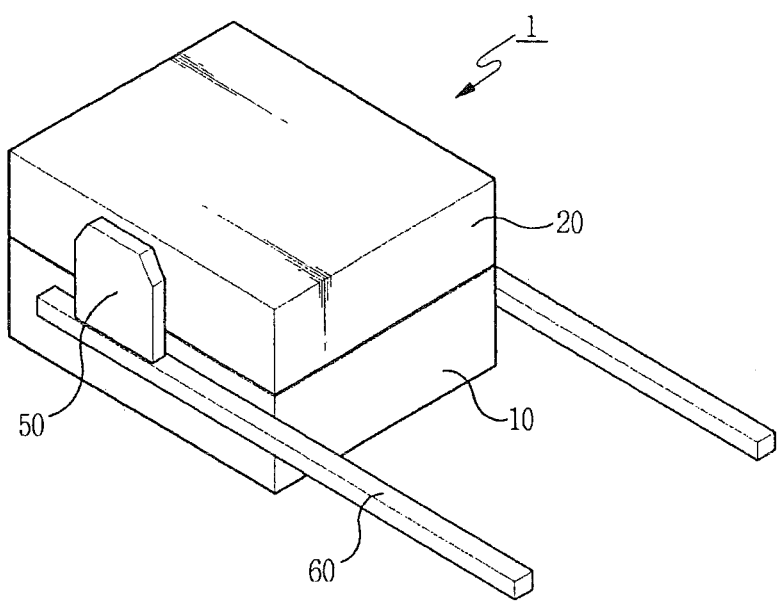
FIG. 2 is a perspective view illustrating an example of an upper cover opening/closing means usable with the prior art processing chamber.
Figure 3:
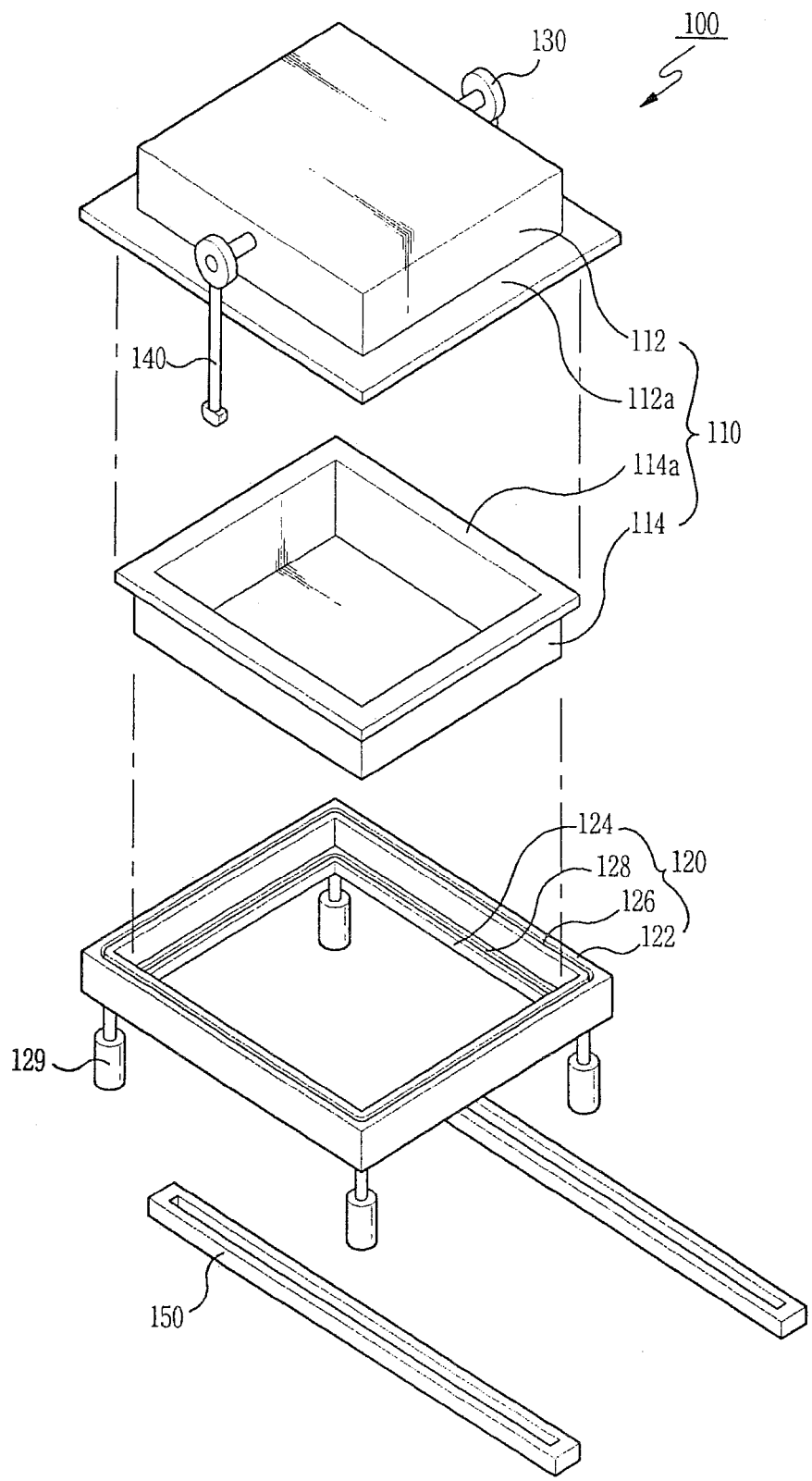
FIG. 3 is an exploded perspective view illustrating an FPD manufacturing apparatus according to a first embodiment of the present invention.
Figure 4:
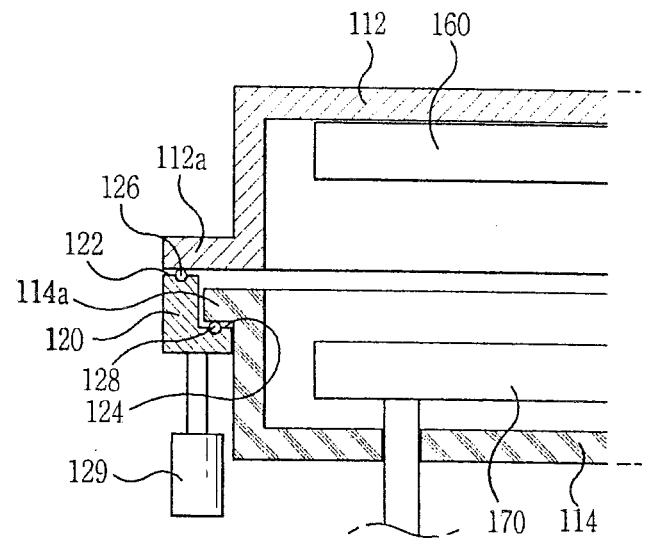
FIG. 4 is a sectional view illustrating the interior structure of the FPD manufacturing apparatus according to the first embodiment of the present invention.

Referring to FIGS. 3 and 4 illustrating an FPD manufacturing apparatus according to a first embodiment of the present invention, the FPD manufacturing apparatus 100 of the first embodiment comprises: a vacuum chamber 110; sealing means 120; a rotating unit 130; a horizontal drive unit 140; a track unit 150; and processor units 160 and 170.

The vacuum chamber 110 is designed to establish a vacuum atmosphere therein. In the present embodiment, the vacuum chamber 110 is divided into a chamber body 114 and an upper cover 112. The chamber body 114 forms a lower chamber section of the vacuum chamber 110, and is constituted by a bottom wall and a sidewall vertically extending upward from the periphery of the bottom wall. The upper cover 112 forms an upper chamber section of the vacuum chamber 110, and is constituted by a top wall and a sidewall vertically extending downward from the periphery of the top wall. As the upper cover 112 is coupled with the chamber body 114, the vacuum chamber 110 is completed. In such a coupled state, according to the present embodiment, the upper cover 112 and the chamber body 114 are spaced apart from each other by a predetermined distance, rather than being directly coupled with each other. Accordingly, the upper cover 112 does not come into close contact with the chamber body 114 even after being coupled to the chamber body 114. The upper cover 112 is positioned to correspond to the chamber body 114, and is then supported by means of the horizontal movement unit 140, so that it is spaced apart from the top of the chamber body 114 by a predetermined distance while being supported by the horizontal drive unit 140.

As a result, there is a gap between the chamber body 114 and the upper cover 112. The sealing means 120 serves to close such a gap by sealing rims of the chamber body 114 and the upper cover 112. As will be easily understood, in a state wherein the chamber body 114 and the upper cover 112 are spaced apart from each other by a predetermined distance, establishing a vacuum atmosphere in the vacuum chamber 110 requires means for sealing the gap therebetween. In the present embodiment, the sealing means 120 is detachably coupled to the upper cover 112.

For this, the chamber body 114 is provided around an upper end surface thereof with a lower flange 114a, which extends along the entire upper end surface to protrude outward from the chamber 110. The upper cover 112 is provided around a lower end surface thereof with an upper flange 112a, which extends along the entire lower end surface to protrude outward from the chamber 110. Here, the upper and surface of the chamber body 114 and the lower end surface of the upper cover 112 are, respectively, an upper end surface of the sidewall of the chamber body 114 and a lower end surface of the sidewall of the upper cover 112.

Correspondingly, the sealing means 120 is provided with upper and lower contact regions 122 and 124, which come into close contact with the respective upper and lower flanges 112a and 114a. To achieve a perfect seal between the upper and lower contact regions 122 and 124 and the upper and lower flanges 112a and 114a, it is essential that contact surfaces of respective members be shaped to correspond to each other.

However, due to the fact that a chamber sidewall is usually made of a hard material such as metal, generation of a fine gap between the contact surfaces is unavoidable even if the upper and lower flanges and the upper and lower contact regions are very delicately machined. For this reason, it is very difficult to maintain perfect air-tightness of the chamber. To solve this problem, it is desirable that the upper and lower contact regions 122 and 124 be provided at the contact surfaces thereof with sealing subsidiaries 126 and 128, respectively. The sealing subsidiaries 126 and 128 are slightly flexible lines. Accordingly, when the sealing means 120 comes into close contact with the upper and lower flanges 112a and 114a, the sealing subsidiaries 126 and 128 are slightly constricted in a state of being interposed between the upper and lower flanges 112a and 114a and the upper and lower contact regions 122 and 124, to prevent generation of the fine gap between all the contact surfaces. In a particular case, the sealing subsidiaries 126 and 128 may be constituted, respectively, by two or more lines arranged parallel to each other for the sake of a more perfect sealing effect. Also, to prevent the sealing subsidiaries 126 and 128 from shifting from their ideal positions, it is desirable that sealing subsidiary positioning and fixing grooves be formed at the upper and lower contact regions 122 and 124.

Hereinafter, several examples of the contact surface shape of the respective members according to the present embodiment will be explained with reference to FIGS. 4 and 5A to 5C.

First, as shown in FIG. 4, the upper and lower contact regions 122 and 124 of the sealing means 120 define an L-shaped cross section so that they are horizontally parallel to a ground surface. Accordingly, the contact surfaces of the upper and lower flanges 112a and 114a, which will come into close contact with the contact regions 122 and 124, are configured to be horizontally parallel to the ground surface.

Figure 5A:
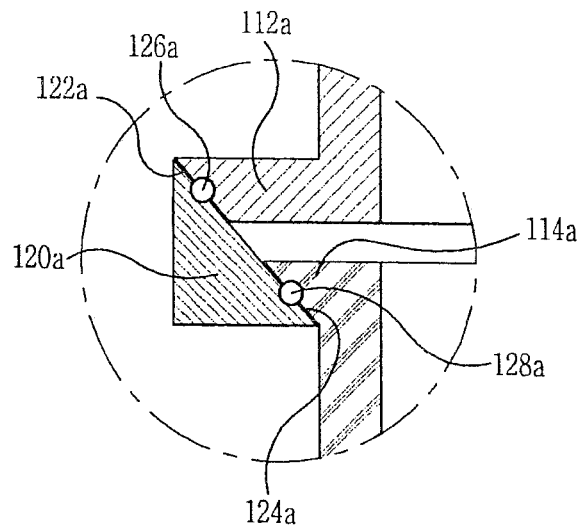
FIGS. 5A to 5C are partial sectional views illustrating alternative embodiments of sealing means according to the present invention.

Alternatively, as shown in FIG. 5A, sealing means 120a may have inclined upper and lower contact regions 122a and 124a and corresponding upper and lower flanges 112a and 114a to be coupled with the upper and lower contact regions 122a and 124a may be inclined with the same angle as the contact regions 122a and 124a. This inclined configuration increases a contact area between the respective members as compared to the previously described horizontal configuration, and can achieve an enhancement in sealing effect. Furthermore, the inclined upper and lower contact regions 122a and 124a having an increased area enable a plurality of sealing subsidiaries 126a and 128a to be easily arranged thereon.

Figure 5B:
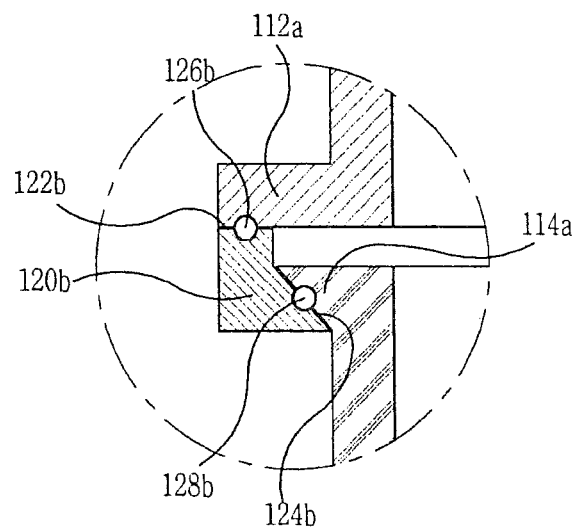
Figure 5C:
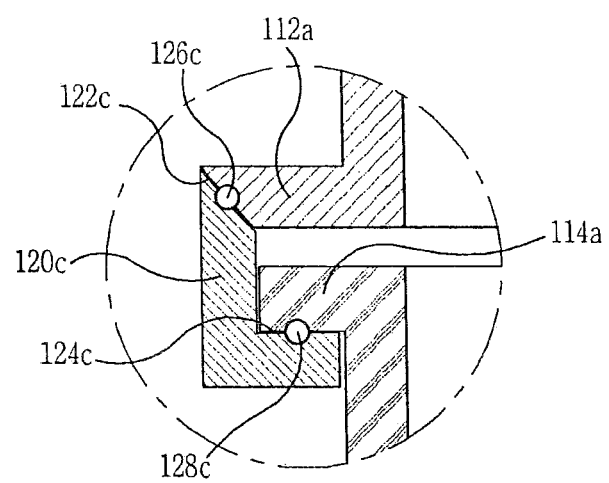

Alternatively, as shown in FIGS. 5B and 5C, only one of the upper and lower contact regions 122a and 124a has an inclined shape.

The sealing means 120 of the present embodiment is further provided with a vertical drive unit 129 to be moved vertically in an automated manner. Specifically, a plurality of vertical drive units 129 are coupled to the bottom of the sealing means 120 to vertically move the sealing means 120. Referring again to FIG. 3, in the present embodiment, four vertical drive units 129 are provided at respective corners of the sealing means 120 to vertically move the sealing means 120 with an enhanced stability. Alternatively, two vertical drive units 129 may be provided at opposite lateral surfaces of the sealing means 120, respectively. Upon opening of the upper cover 112, the vertical drive units 129 act to move the sealing means 120 downward, in order to prevent friction between the upper cover 112 and the sealing means 120.

Each of the vertical drive units 129 consists of a cylinder rod and a cylinder as shown in FIG. 4. The cylinder rod is coupled to the bottom of the sealing means 120 and serves to move the sealing means 120 in a vertical direction. The cylinder is coupled to a lower end of the cylinder rod and serves to drive the cylinder rod. Here, the cylinder may be a pneumatic cylinder or hydraulic cylinder. Accordingly, the cylinder rod is moved vertically upon receiving a cylinder pressure, so that the sealing means 120, connected to the cylinder rod, is moved vertically.

The rotating unit 130 serves to rotate the upper cover 112, so that the interior of the upper cover 112 faces upward to be exposed to the outside. In the present embodiment, as shown in FIG. 3, a pair of rotating units 130 is coupled to corresponding central positions of opposite lateral surfaces of the upper cover 112 by interposing shafts. Each of the rotating units 130 contains a motor, which provides a drive force required to rotate the upper cover 112 coupled to the rotating units 130. Preferably, a bearing is inserted in a coupling portion between each shaft, which is coupled to the upper cover 112, and the corresponding rotation motor, to minimize generation of frictional force upon rotation of the upper cover 112, thereby ensuring smooth rotation of the upper cover 112.

A pair of the horizontal drive units 140 is coupled to a respective one of the rotating units 130, so that they serve to support the upper cover 112 and to horizontally move the upper cover 112 coupled to the rotating units 130. Specifically, the horizontal drive units 140 are coupled to the bottom of the respective rotating units 130, which are previously coupled to the upper cover 112, so that they not only support the upper cover 112, but also horizontally move the upper cover 112 upon opening of the upper cover 112. Admittedly, the horizontal drive units 140 may be directly coupled to certain portions of the upper cover 112 without interposing the rotating units 130. Each of the horizontal drive units 140 consists of a rotating unit coupling portion, a supporting shaft, and a track unit coupling portion for horizontal movement thereof.

A pair of the track units 150 is coupled to a respective one of the horizontal drive units 140 for providing a movement path of the horizontal drive units 140. That is, when it is desired to horizontally move the upper cover 112 to open the upper cover 112, the track units 150 provide an accurate and stable path for horizontal movement of the horizontal drive units 140. If such an accurate and stable movement path for the horizontal drive units 140 is not provided, the horizontal drive units 140 may be operate in an unsafe fashion because the upper cover 112, supported by the horizontal drive units 140, has a very large size and heavy weight. The track units 150 of the present embodiment, as shown in FIG. 3, take the form of linear guides. The track units 150 are coupled to a lower frame (not shown), which is installed on the floor of a clean room so that the vacuum chamber 110 is spaced apart from the clean room floor. Accordingly, the track units 150 can be conveniently installed without requiring a difficult process to drill track unit installation holes through sidewalls of the vacuum chamber 110.

The processor units (not shown in FIG. 3) serve to perform a desired process for a substrate loaded in the vacuum chamber 110. Here, the desired process for the substrate includes a deposition process for forming a film, made of a desired material, on a substrate surface, and an etching process for removing a fraction of the formed film. Accordingly, the vacuum chamber 110 according to the present embodiment is applicable to various processing apparatuses including a deposition apparatus and an etching apparatus. For example, a dry etching apparatus, includes, as processor units, upper and lower electrodes provided in upper and lower locations of a chamber, an electric power supplier for supplying RF electric power to the upper and lower electrodes, and a gas supplier for introducing process gas into the chamber.

The FPD manufacturing apparatus 100 according to the present embodiment further comprises a control unit to control opening/closing operations of the upper cover 112. When the sealing means 120 has to be lowered by a predetermined distance for smooth opening of the upper cover 112, the control unit controls associated elements based on preset data related to desired operating time and lowering distance of the vertical drive units 129. Then, if the sealing means 120 is completely lowered, the control unit controls the horizontal drive units 140 to horizontally move the upper cover 112 based on preset data related to desired movement speed and distance of the horizontal drive units 140. If the horizontal drive units 140 are moved by a sufficient distance for rotation of the upper cover 112, the control unit immediately drives the rotating units 130 to rotate the upper cover 112 by an exact angle of 180 degrees.

Hereinafter, the opening/closing procedure of the upper cover 112 provided in the FPD manufacturing apparatus 100 according to the present embodiment will be described.

Figure 6A:
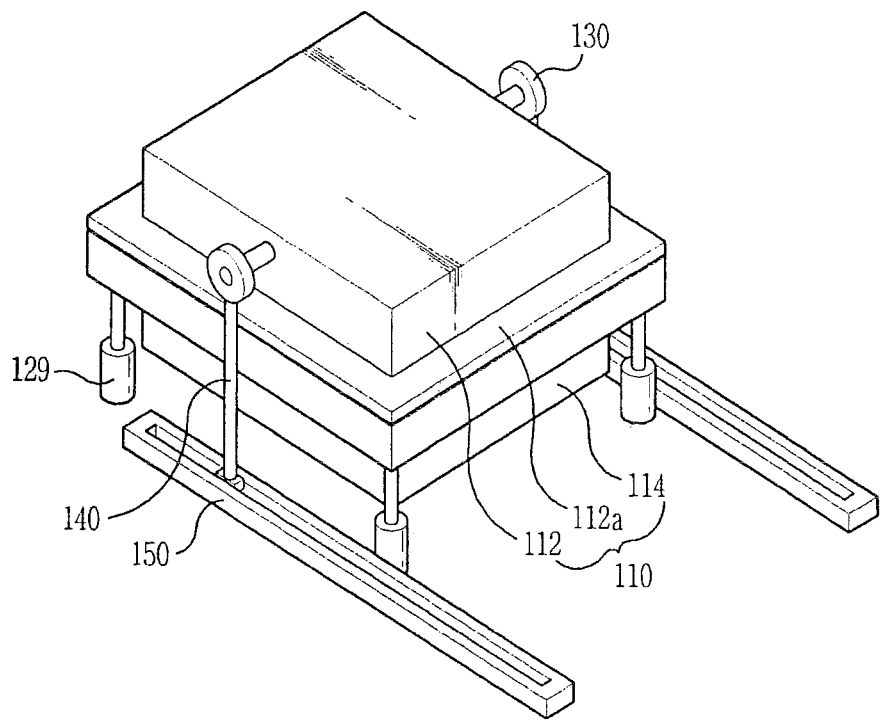
FIGS. 6A to 6D are perspective views explaining the opening/closing procedure of an upper cover employed in the FPD manufacturing apparatus according to the first embodiment of the present invention.
Figure 6B:
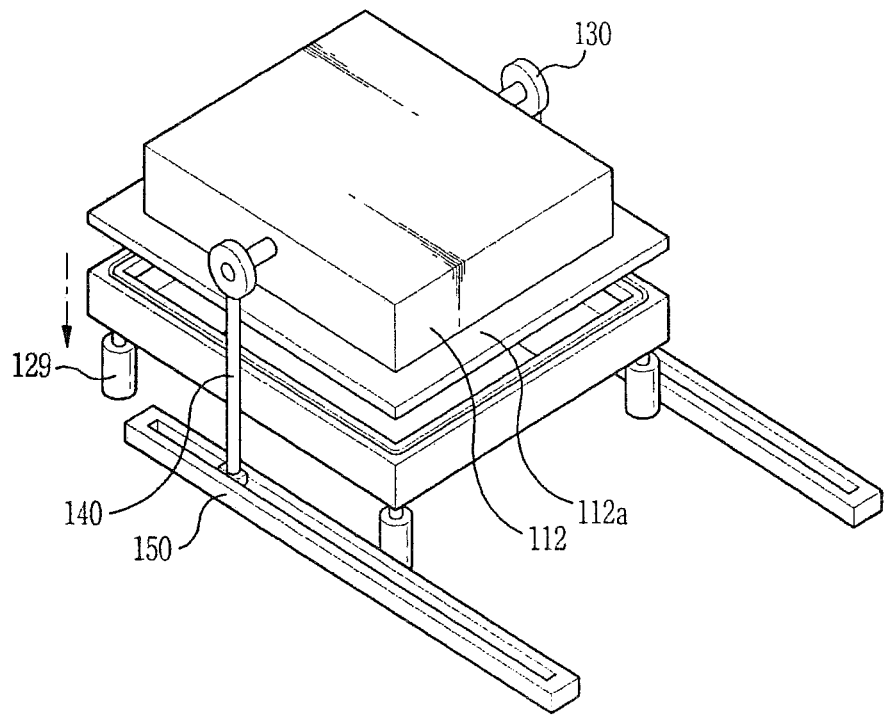

The FPD manufacturing apparatus 100 according to the present embodiment is adapted to perform a desired process for a substrate in a state wherein the chamber body 114 and the upper cover 112 are hermetically sealed by the sealing means 120 as shown in FIG. 6A. When it is necessary to repair elements provided inside the chamber, first, the vertical drive units 129 are driven to space the sealing means 120 apart from both the upper cover 112 and the chamber body 114 by predetermined distances as shown in FIG. 6B. If the sealing means 120 is separated from the upper cover 112, the upper cover 112 is easily movable in a horizontal direction because only the rotating units 130 are in contact with the upper cover 112.

Figure 6C:
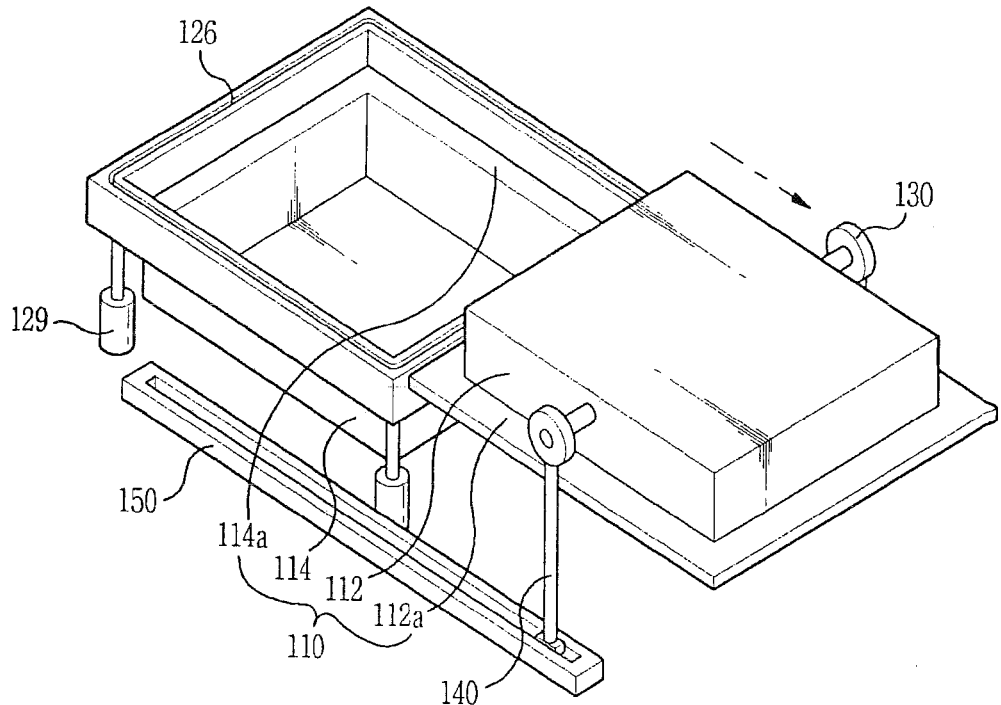

Then, if the sealing means 120 is completely lowered, the horizontal drive units 140 are driven to separate the upper cover 112 from the top of the chamber body 114 as shown in FIG. 6C. Specifically, the horizontal drive units 140 are horizontally moved along the track units 150 to provide the upper cover 112 with a sufficient rotation radius.

Figure 6D:
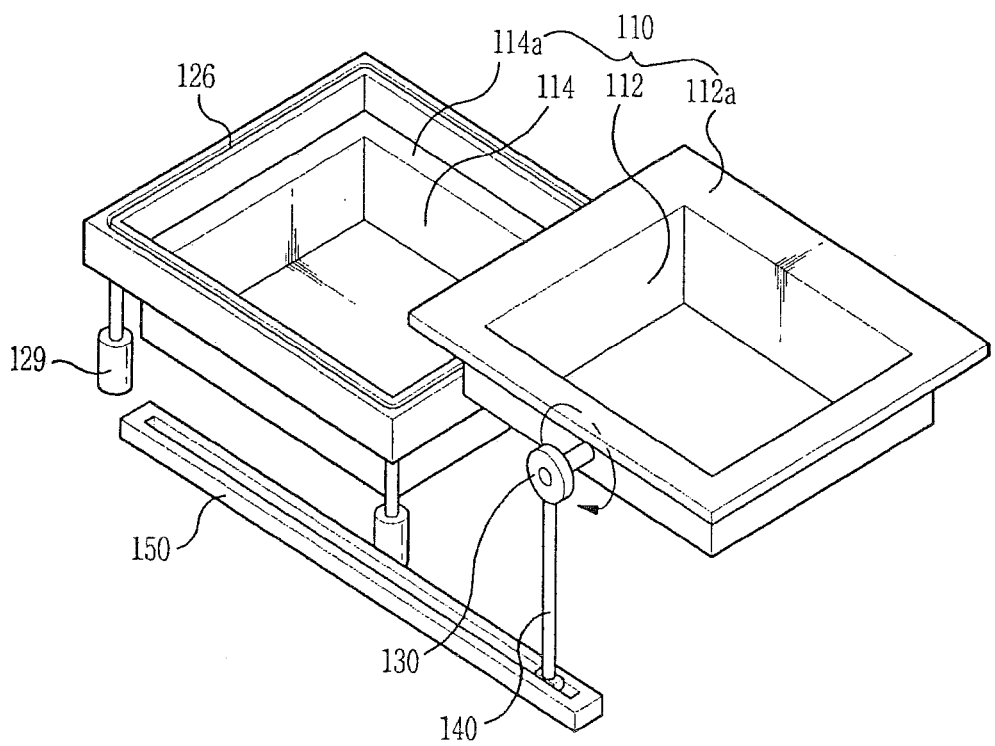

If the sufficient rotation radius of the upper cover 112 is secured, the rotating units 130 are driven to rotate the upper cover 112 by 180 degrees as shown in FIG. 6D. As a result, the interior of the upper cover 112 faces upward, so that maintenance and repair operations can be carried out for various processor units arranged in the upper cover 112.

If all the maintenance and repair operations are completed, the upper cover 112 is closed by performing the above opening procedure in reverse.

The present embodiment allows the upper cover 112 to be opened and closed in an automated manner under operation of the control unit, so that chamber maintenance and repair operations can be more easily carried out.

Second Embodiment

An FPD manufacturing apparatus according to the present embodiment comprises: a vacuum chamber; sealing means; and processor units. In the same manner as the first embodiment, the vacuum chamber includes a chamber body and an upper cover, and the sealing means is configured to seal rims of the chamber body and the upper cover. The processor units are arranged in the vacuum chamber to perform a desired process for a substrate. The configurations and functions of the vacuum chamber, sealing means, and processor units are identical to those of the first embodiment, and accordingly, no further description will be given.

Differently from the first embodiment, the FPD manufacturing apparatus of the present embodiment is not provided with the rotating units, horizontal movement units, and track units. The upper cover of the present embodiment is spaced apart from the chamber body by a predetermined distance by use of separate supporting members. The supporting members are coupled at lower ends thereof to the above-described lower frame to support the upper cover. Upper ends of the supporting members are separably coupled to the upper cover. As occasion demands, four supporting members may be coupled to respective corners of the upper cover or two supporting members may be coupled to corresponding opposite lateral surfaces of the upper cover.

Admittedly, it should be noted that the upper cover may be spaced apart from the chamber body by a predetermined distance while being supported by sealing means, in place of being supported by the supporting members.

In the present embodiment, it is desirable that fastening means be further provided at corresponding locations of opposite lateral surfaces of the upper cover. The fastening means are for use in the coupling of an upper cover opening/closing device, which is independently provided and operated from the FPD manufacturing apparatus of the present embodiment. The upper cover opening/closing device is designed to horizontally move and rotate the upper cover. Accordingly, as the fastening means are coupled to the upper cover opening/closing device, the upper cover can be horizontally moved and rotated by the opening/closing device.

Third Embodiment

Figure 7:
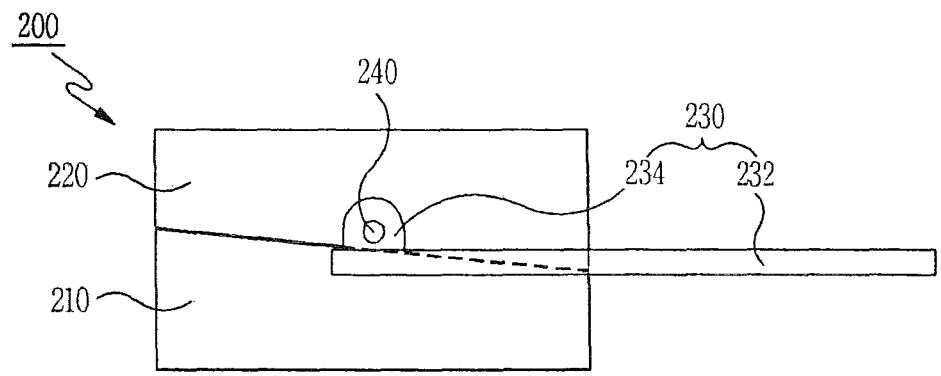
FIG. 7 is a side view illustrating the configuration of an FPD manufacturing apparatus according to a third embodiment of the present invention.

Referring to FIG. 7 illustrating an FPD manufacturing apparatus 200 according to the third embodiment of the present embodiment, the FPD manufacturing apparatus 200 comprises a lower chamber 210; an upper chamber 220; a horizontal drive unit 230; and a rotating unit 240. The lower and upper chambers 210 and 220 have downwardly inclined coupling surfaces, which extend in a movement direction of the upper chamber 220. That is, the coupling surfaces of both the lower and upper chambers 210 and 220 are inclined in a specific direction, i.e. are inclined downwardly in the movement direction of the upper chamber 220, rather than being horizontally parallel to the ground surface. With the inclined coupling surfaces of the lower and upper chambers 210 and 220, the upper chamber 220 can be easily separated from the lower chamber 210 as it horizontally slides on the lower chamber 210 without friction therebetween. This eliminates the necessity of lifting the upper chamber 220 by a predetermined height in order to prevent generation of friction between the lower and upper chambers 210 and 220 upon opening of the upper chamber 220. Accordingly, the FPD manufacturing apparatus 200 of the present embodiment does not requires any vertical drive units, achieving a simplified structure and reduced manufacturing costs.

To securely maintain air-tightness of the chambers, it is desirable that a sealing member 250 be interposed between the coupling surfaces of the lower and upper chambers 210 and 220. Accordingly, one of the coupling surfaces of the lower and upper chambers 210 and 220 is formed with a sealing member arrangement recess 260 for the insertion of the sealing member 250. As shown in FIGS. 8A and 8B, and 9A and 9B, the sealing member arrangement recess 260 is configured such that an entrance is narrower than an interior space of the recess to prevent the sealing member 250 from being unintentionally separated from the recess 260 after being inserted. As the sealing member 250 having a predetermined flexibility is deformed upon receiving an external force, the sealing member 250 can be stably inserted so as not to be easily separated from the recess 260.

In the present embodiment, it is desirable that the sealing member 250 be capable of varying a relative position with respect to the coupling surfaces of the chambers. Specifically, a fraction of the sealing member 250 differently protrudes out of the sealing member arrangement recess 260 in accordance with the positional relationship between the sealing member 250 and the recess 260, so that the relative position of the sealing member 250 can be varied in accordance with the opening/closing procedure of the upper chamber 220. However, due to the fact that the upper chamber 220 is opened or closed via only horizontal movement without vertical lifting, the sealing member 250 may be damaged when it protrudes out of the sealing member arrangement recess 260 upon horizontal movement of the upper chamber 220. Accordingly, it is desirable that the sealing member 250 is completely lowered into the recess 260 during horizontal movement of the upper chamber 220, and then, protrudes out of the recess 260 only while a vacuum atmosphere is established in the chambers, thereby serving to maintain air-tightness of the chambers.

In the present embodiment, the relative position of the sealing member 250 can vary in following three methods.

Figure 8A:
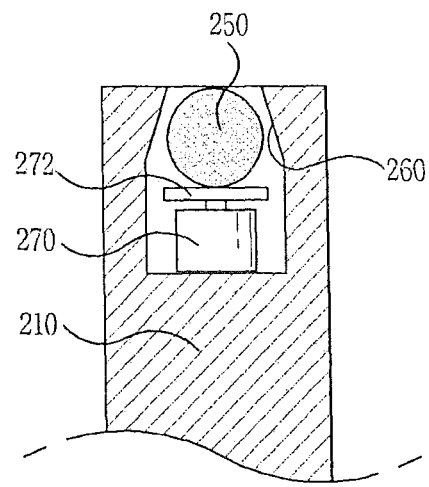
FIGS. 8A and 8B are partial sectional views illustrating operation of a sealing member drive unit according to the third embodiment of the present invention.
Figure 8B:
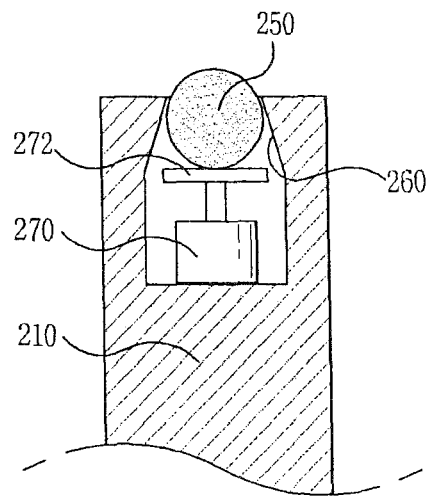

A first method is to utilize a sealing member drive unit 270, which applies a mechanical force to the sealing member 250 to vary the relative position of the sealing member 250, as shown in FIGS. 8A and 8B. The sealing member drive unit 270 is arranged in the sealing member arrangement recess 260 on the inside of the sealing member 250. The drive unit 270 has a piston structure to push the sealing member 250 outward from the recess 260. In conjunction with a variation in the position of the sealing member 250, it is desirable that the entirety of the sealing member 250 be equally forced and displaced for the sake of maintenance of air-tightness of the chambers. To serve as a mediator for uniformly transmitting force from the sealing member drive unit 270 to the sealing member 250, a force transfer plate 272 is interposed between the sealing member 250 and the drive unit 270.

With the above-described first method, the sealing member 250 is located in the sealing member arrangement recess 260 in a retracted state of the piston type drive unit 270 as shown in FIG. 8A. Then, if the drive unit 270 is extended to push the sealing member 250 out of the recess 260, the sealing member 250 is pushed out of the recess 260 as shown in FIG. 8B, to maintain air-tightness of the chambers.

Figure 9A:
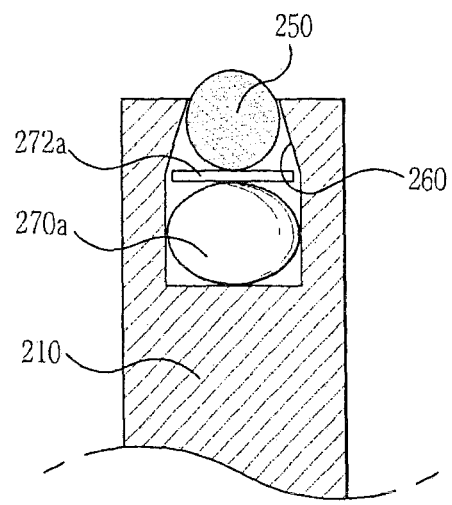
FIGS. 9A and 9B are partial sectional views illustrating operation of another sealing member drive unit according to the third embodiment of the present invention.
Figure 9B:
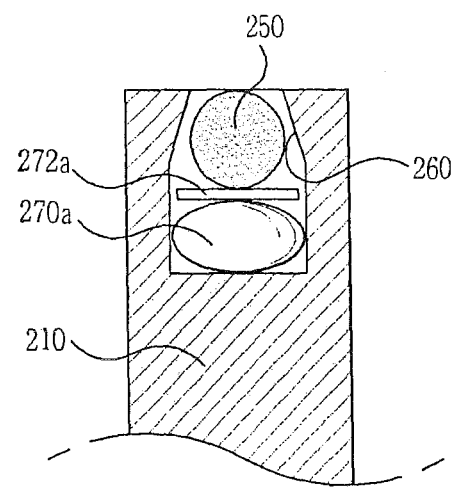

A second method is to utilize a pneumatic sealing member drive unit 270a received in the sealing member arrangement recess 260, as shown in FIGS. 9A and 9B. The pneumatic sealing member drive unit 270a is connected to an external air pump (not shown), so that the drive unit 270a is expanded if air is injected thereinto, and is also constricted at the same time with discharge of the air. Likewise, it is preferred that a force transfer plate 272a be interposed between the sealing member 250 and the drive unit 270a.

Accordingly, to maintain air-tightness of the chambers, first, air is injected into the sealing member drive unit 270a by the air pump to expand the drive unit 270a. The expanded drive unit 270a pushes the sealing member 250 out of the sealing member arrangement recess 260 as shown in FIG. 9A, thereby allowing the chambers to be hermetically sealed. Conversely, when the opening/closing operations of the upper chamber 220 are carried out, the air injected in the drive unit 270a is discharged by the air pump so that the drive unit 270a is constricted. As a result, the sealing member 250 is again lowered into the recess 260 as shown in FIG. 9B.

Figure 10A:
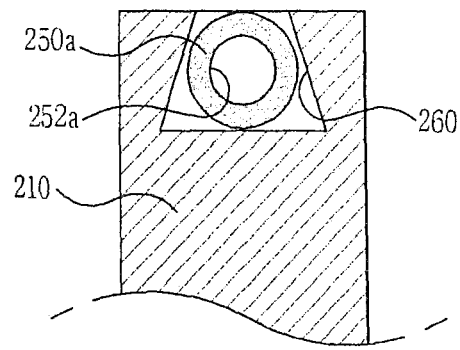
FIGS. 10A and 10B are partial sectional views illustrating operation of a sealing member according to the third embodiment of the present invention.
Figure 10B:
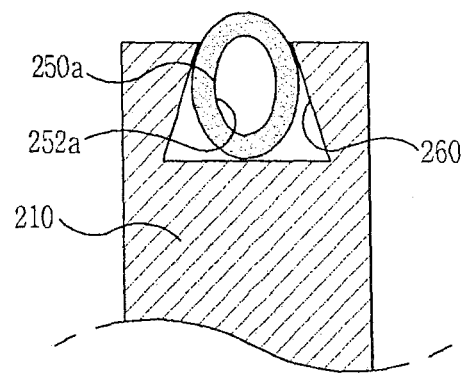

A third method is to provide a sealing member 250a with an inner air passage 252a so that the sealing member 250a can be pneumatically expanded or constricted, as shown in FIGS. 10A and 10B. In this case, the sealing member 250a is directly connected to an external air pump (not shown) to be expanded or constricted. Accordingly, when it is desired to maintain air-tightness of the chambers, air is injected into the sealing member 250a by use of the air pump, so that a fraction of the sealing member 250a protrudes out of the sealing member arrangement recess 260 as shown in FIG. 10B. Then, when the opening/closing operations of the upper chamber 220 are carried out, the air injected in the sealing member 250a is discharged by the air pump so that the sealing member 250a is constricted and is completely received in the recess 260 as shown in FIG. 10A.

The horizontal drive unit 230 is used to horizontally move the upper chamber 220. In the present embodiment, a pair of horizontal drive units 230 normally supports the upper chamber 220, so that they horizontally move the upper chamber 220 to separate the upper chamber 220 from the lower chamber 210. Referring again to FIG. 7, each of the horizontal drive units 230 includes an elongated horizontal guide 232 for providing a horizontal movement path, and a horizontal drive motor 234 to move along the horizontal guide 232. The drive motor 232 has a wheel shape capable of moving in a state of being coupled with the horizontal guide 234.

The rotating unit 240 serves to rotate the upper chamber 220. In the present embodiment, a pair of the rotating units 240 is coupled to central positions of opposite lateral surfaces of the upper chamber 220, and each has a motor to rotate the upper chamber 220. As shown in FIG. 7, the rotating units 240 are integrally formed with the respective horizontal drive units 230. Accordingly, the rotating units 240 are first moved along with the horizontal drive units 230, and then, act to rotate the upper chamber 220 after the upper chamber 220 is moved to be completely separated from the lower chamber 210 by the horizontal drive units 230.

Hereinafter, the opening/closing procedure of the upper chamber 220 provided in the FPD manufacturing apparatus 200 according to the present embodiment will be described with reference to FIGS. 11A and 11B.

Figure 11A:
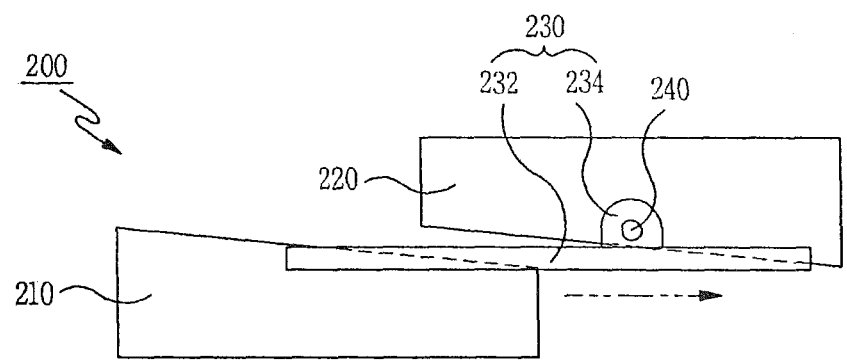
FIGS. 11A and 11B are views explaining an upper chamber opening/closing procedure performed by the FPD manufacturing apparatus according to the third embodiment of the present invention.

First, as shown in FIG. 11A, the upper chamber 220 is horizontally moved. In this case, prior to beginning horizontal movement of the upper chamber 220, the sealing member 250 is lowered by use of the sealing member drive unit 270 to prevent the sealing member 250 from coming into contact with the upper chamber 220. Subsequently, the upper chamber 220 is moved by use of the horizontal drive units 230 to a position that secures a sufficient rotation radius thereof.

Figure 11B:
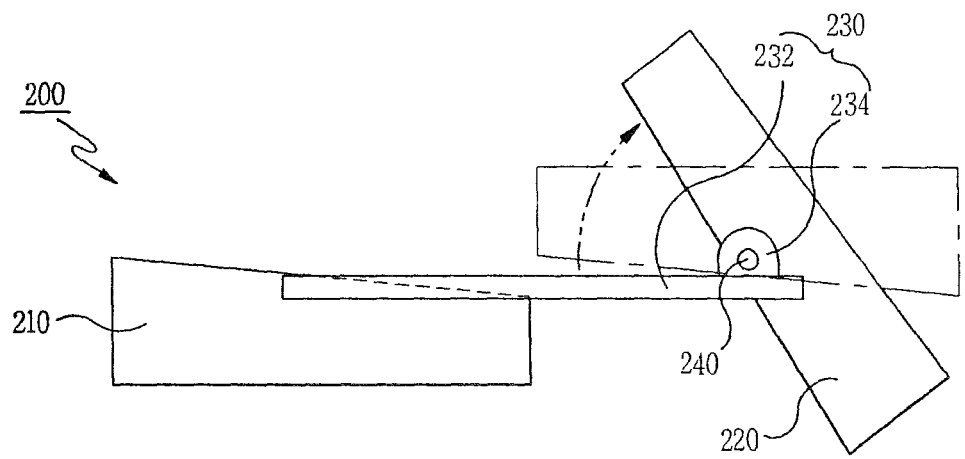
Figure 12:
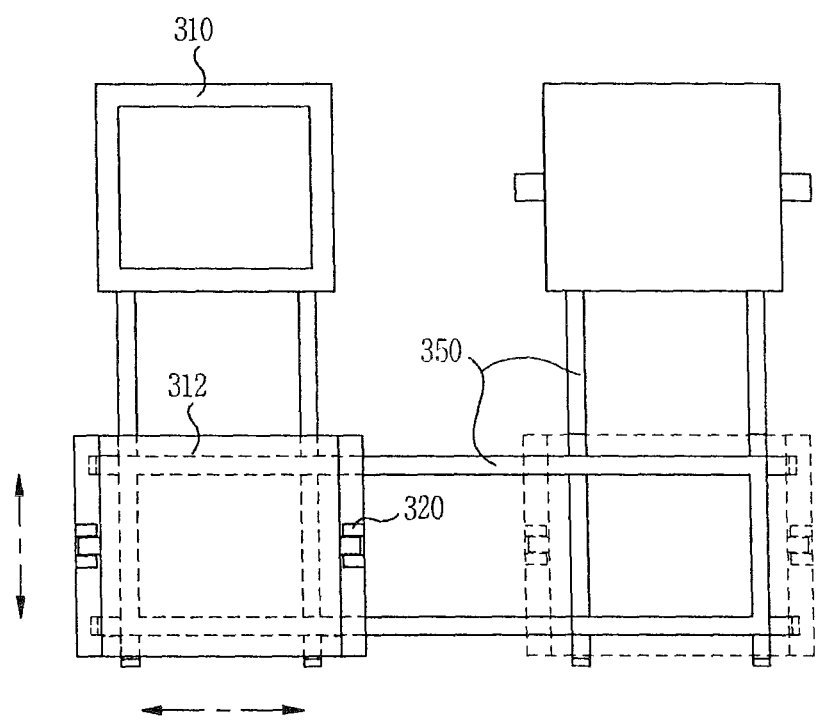
FIG. 12 is a plan view illustrating the configuration and layout of an upper cover opening/closing device according to a fourth embodiment of the present invention.
Figure 13:
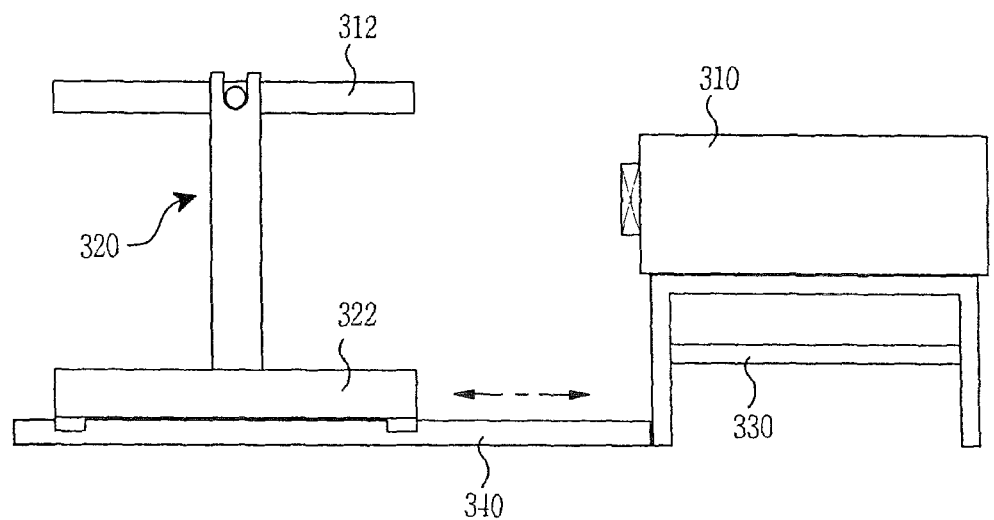
FIG. 13 is a side view of FIG. 12.

After that, as shown in FIG. 11B, the upper chamber 220 is rotated. Specifically, the rotating units 240 are driven to rotate the upper chamber 220 by 180 degrees, so that various elements provided in the upper chamber 220 are opened upward to the outside.

In such an upwardly opened state of the upper chamber 220, any maintenance and repair operations with respect to the upper chamber 220 are carried out. After that, the upper chamber is closed by performing the above-described opening procedure in reverse.

Fourth Embodiment

The present embodiment provides an upper cover opening/closing device usable with a plurality of vacuum chambers arranged adjacent to one another.

Generally, to couple a first upper cover to a corresponding first vacuum chamber, the upper cover opening/closing device is moved to a position close to the first vacuum chamber. Also, to separate or couple another second upper cover from or to a corresponding second vacuum chamber, the opening/closing device is moved to the second vacuum chamber to open the second upper cover at a position close to the second vacuum chamber.

The upper cover opening/closing device according to the present embodiment includes a cover loading unit 320, which serves to support and rotate an upper cover 312 separated from a vacuum chamber 310.

In a state wherein the upper cover 312 is disposed thereon, the cover loading unit 320 is moved close to the vacuum chamber 310, so that the upper cover 312 is shifted onto the top of the vacuum chamber 310 by use of a crane or other transportation means. In this case, to shift and couple the upper cover 312 to the vacuum chamber 310, the upper cover 312 is provided at an upper surface thereof with a plurality of connecting loops (not shown).

In operation, first, the cover loading unit 320 moves the upper cover 312 seated thereon to a position close to the vacuum chamber 310. Subsequently, the cover loading unit 320 shifts and couples the upper cover 312 to the top of the vacuum chamber 310 by use of a crane, which is normally arranged in an upper region of a clean room. For the fastening of the crane, the cover loading unit 320 is provided at opposite lateral sides thereof with upwardly protruding extensions each having a central recess defined at an upper end thereof, and the upper cover 312 is provided at opposite lateral sides thereof with outwardly protruding pins, so that the pins of the upper cover 312 are seated on an upper end of the cover loading unit 320. After that, the upper cover 312 is rotated by rotating drive units (not shown) arranged around a rotation axis, for easy coupling to the vacuum chamber 310 or for exposure of the interior thereof.

The upper cover opening/closing device of the present embodiment further includes a track unit 350, serving as a rail. The track unit 350 is configured to allow the cover loading unit 320 to move close to a respective one of the vacuum chambers 310 while moving from one vacuum chamber 310 to another.

Beneath each of the vacuum chambers 310 is provided a supporting table 340 for locating the vacuum chamber 310 at a proper height while protecting the vacuum chamber 310 from external shock. Similarly, beneath the cover loading unit 320 is provided a supporting die 330.

Figure 14A:
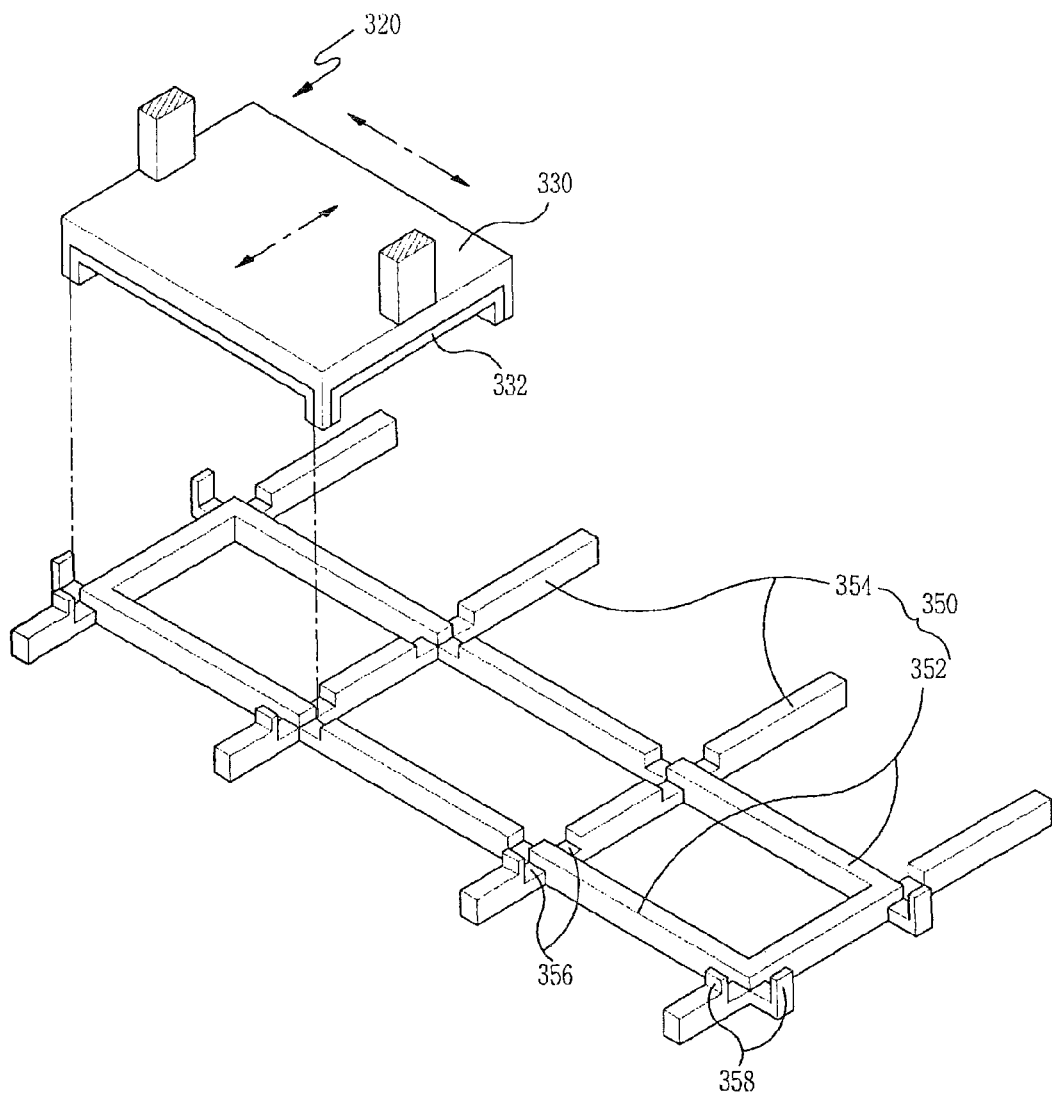
FIGS. 14A and 14B are perspective views illustrating different examples of a cover loading unit and a track unit included in the upper cover opening/closing device according to the fourth embodiment of the present invention.

As shown in FIG. 14A, the track unit 350 of the present embodiment includes: main tracks 352 arranged parallel to an arrangement direction of a plurality of the vacuum chambers 310, and auxiliary tracks 354 arranged perpendicular to the main tracks 352 to define a movement path toward a respective one of the vacuum chambers 310. The main tracks 352 are a pair of bars, having a male cross section, to allow the supporting die 330 of the cover loading unit 320 to move parallel to the vacuum chambers 310. The auxiliary tracks 354 are pairs of bars connected perpendicular to the main tracks 352 to allow the supporting die 330 of the cover loading unit 320 to move toward or away from the respective vacuum chambers 310. Here, a pair of the auxiliary tracks 354 is allotted to a respective one of the vacuum chambers 310.

At a lowermost portion of the cover loading unit 320, i.e. at a lower surface of the supporting die 330, is provided a recessed movable block 332. The movable block 332 of the supporting die 330 is seated on the track unit 350 to move longitudinally or transversely in a state of being in contact with an upper surface of the track unit 350.

The recessed movable block 332 is provided at corners thereof with downwardly extending protrusions. Thus, to prevent the protrusions of the movable block 332 from being caught when the supporting die 330 slides on the upper surface of the track unit 350, the track unit 350 is formed with recesses 356 at predetermined locations around intersections of the main and auxiliary tracks 352 and 354. Also, stoppers 358 are provided at predetermined locations around the intersections of the track unit 350 to restrict the supporting die 330 at a predetermined exact position where the cover loading unit 320 is coaxially aligned with a desired one of the vacuum chambers 310.

Rigid spherical friction reducing means (not shown) are provided at contact portions between the supporting die 330 and the track unit 350 to come into rolling contact with the bottom of the supporting die 330 or the upper surface of the track unit 350, so that the supporting die 330 can move with a minimized frictional resistance.

In addition, drive means (not shown) is provided on the track unit 350 to provide electric power required to move the supporting die 330 of the cover loading unit 320 longitudinally or transversely along the track unit 350.

The drive unit also serves to drive and control the friction reducing means. Here, the friction reducing means are oriented in Y-axis and X-axis directions to longitudinally or transversely move on the track unit 350.

Figure 14B:
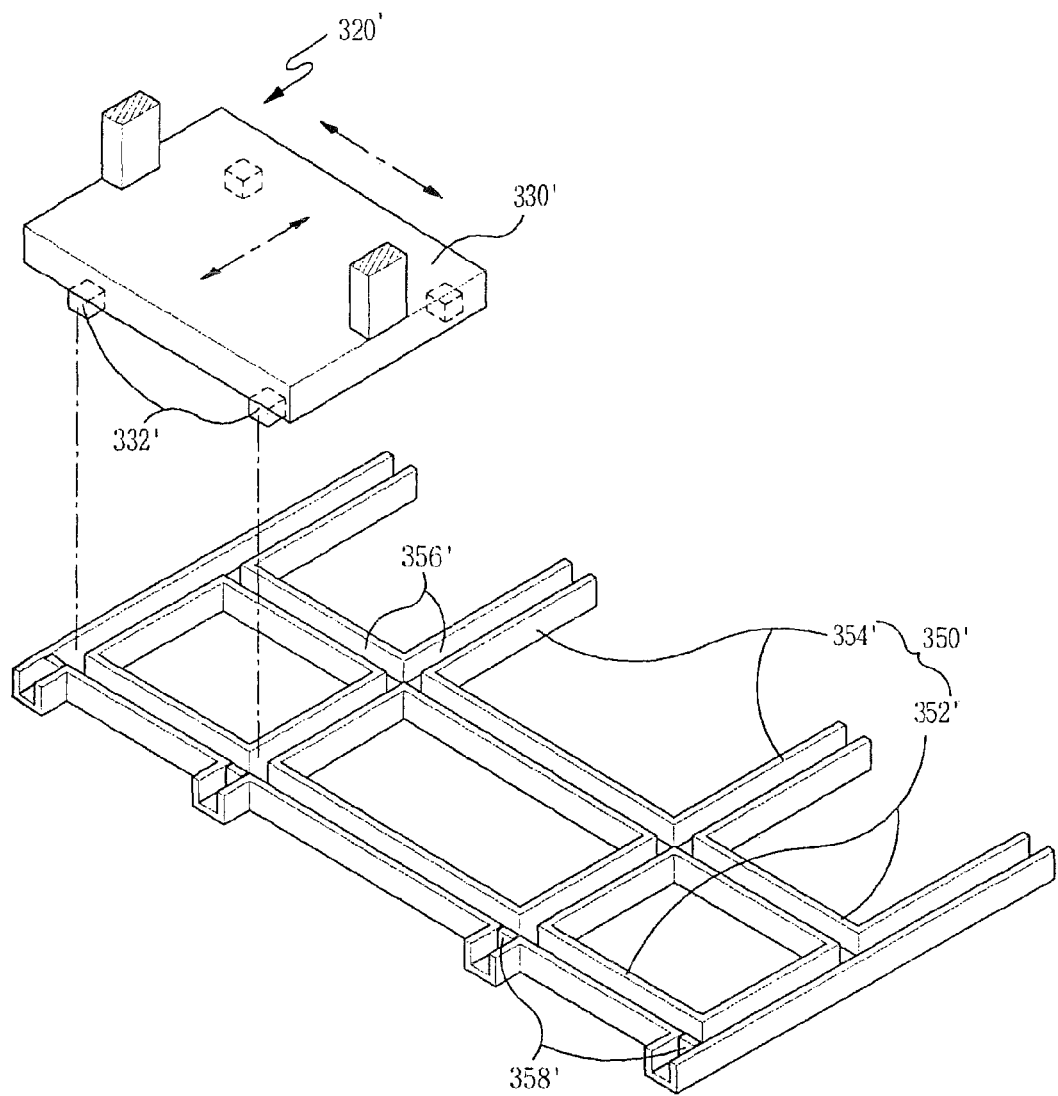

FIG. 14B illustrates a track unit 350' according to an alternative embodiment of the present invention. As shown in FIG. 14B, the track unit 350' includes main tracks 352' arranged parallel to the arrangement direction of the vacuum chambers 310, and auxiliary tracks 354' arranged perpendicular to the main tracks 352' to provide a movement path toward a respective one of the vacuum chambers 310. The main tracks 352 are a pair of bars having a female cross section to define a movement groove 356' therein. The main tracks 352' extend to allow a supporting die 330' of a cover loading unit 320' to move parallel to the vacuum chambers 310. The auxiliary tracks 354' are pairs of bars connected perpendicular to the main tracks 352' to allow the supporting die 330' of the cover loading unit 320' to move toward or away from a respective one of the vacuum chambers 310. Each of the auxiliary tracks 354' is formed with the movement groove 356' therein, and a pair of the auxiliary tracks 354' is allotted to a respective one of the vacuum chambers 310.

At a lowermost portion of the cover loading unit 320', i.e. at a lower surface of the supporting die 330', are provided cubic movable blocks 332'. The movable blocks 332 of the supporting die 330 are seated on the track unit 350' to move longitudinally or transversely in a state of being in contact with an upper surface of the track unit 350'.

The movable blocks 332 are provided near corners of the lower surface of the supporting die 330'. The movable blocks 332 are inserted into the grooves 356' of the track unit 350' to move longitudinally or transversely in a state of being in contact with the track unit 350', so that the supporting die 330' can smoothly slide on the track unit 350' without risk of unintentional separation.

Stoppers 358' are provided at predetermined locations around intersections of the main and auxiliary tracks of the track unit 350'. The stoppers 358' serve to restrict the supporting die 330' at a predetermined exact position where the cover loading unit 320' is coaxially aligned with a desired one of the vacuum chambers 310.

Rigid spherical friction reducing means (not shown) are provided at a contact region between the supporting die 330' and the track unit 350' to come into rolling contact with the lower surface of the supporting die 330' or the upper surface of the track unit 350', so that the supporting die 330' can move with a minimized frictional resistance.

Here, it is desirable that the friction reducing means has a spherical shape suitable to move in any directions.

Drive means (not shown) is provided on the track unit 350', to provide electric power required to transversely or longitudinally move the supporting die 330' of the cover loading unit 320'.

The number of vacuum chambers 310 may be increased or decreased in accordance with a process to be performed, and accordingly, the number and length of the track unit 350 or 350' may be increased or decreased.

Hereinafter, the procedure for coupling an upper cover to a corresponding processing chamber, performed by the upper cover opening/closing device according to the present invention, will be described with reference to FIGS. 12, 13, 14A and 14B.

For example, when it is necessary to repair various elements, such as electrodes, arranged in the vacuum chamber 310 or to inspect the inner surface of the upper cover 312, the upper cover 312 is separated from the top of the vacuum chamber 310. Then, the upper cover 312 has to be again coupled to the top of the vacuum chamber 310 after any repair or inspection operations are completed. For the coupling or separation of the upper cover 312, after the upper cover 312 is seated on the cover loading unit 320 or 320' under operation of rotation drive units of a positioning system, the cover loading unit 320 or 320' may be oriented in a Y-axis direction to move toward or away from a respective one of the vacuum chambers 310 along the track unit 350 or 350', or may be oriented in an X-axis direction to move from one vacuum chamber 310 to another along the track unit 350 or 350'. The track unit 350 or 350' has a lattice pattern extending in Y-axis and X-axis directions.

Accordingly, if the cover loading unit 320 or 320' is moved to a position close to a desired one of the vacuum chambers 310 along the track unit 350 and 350' so that the cover loading unit 320 is coaxially aligned with the vacuum chamber 310, hooks of a crane provided in an upper region of a clean room are caught by the connecting loops of the upper cover 312 that is seated on the cover loading unit 320 or 320'. In this way, the upper cover 312 is moved toward the vacuum chamber 310 and be lowered to an exact position on the top of the vacuum chamber 310, whereby the upper cover 312 can be easily coupled to the vacuum chamber 310.

Separation of the upper cover 312 from the vacuum chamber 310 is performed in reverse to the above-described coupling procedure.

Then, when it is desired to couple another second upper cover 312 to a corresponding second vacuum chamber 310, the cover loading unit 320 or 320' is moved from one vacuum chamber 310 to another. In this case, the position of the cover loading unit 320 or 320' is restricted by the stoppers 358 or 358' so as not to escape a predetermined movement path. Accordingly, the cover loading unit 320 or 320' can move to a position where it is coaxially aligned with the desired vacuum chamber 310.

In summary, to couple the upper cover 312 to the vacuum chamber 310, the cover loading unit 320 or 320', on which the upper cover 312 is seated, is moved in a sliding manner along the lattice patterned track unit 350 or 350', so that the cover loading unit 320 or 320' is coaxially aligned with the vacuum chamber 310, whereby the upper cover 312 can be conveniently shifted and coupled to the vacuum chamber 310.

Fifth Embodiment

Figure 15:
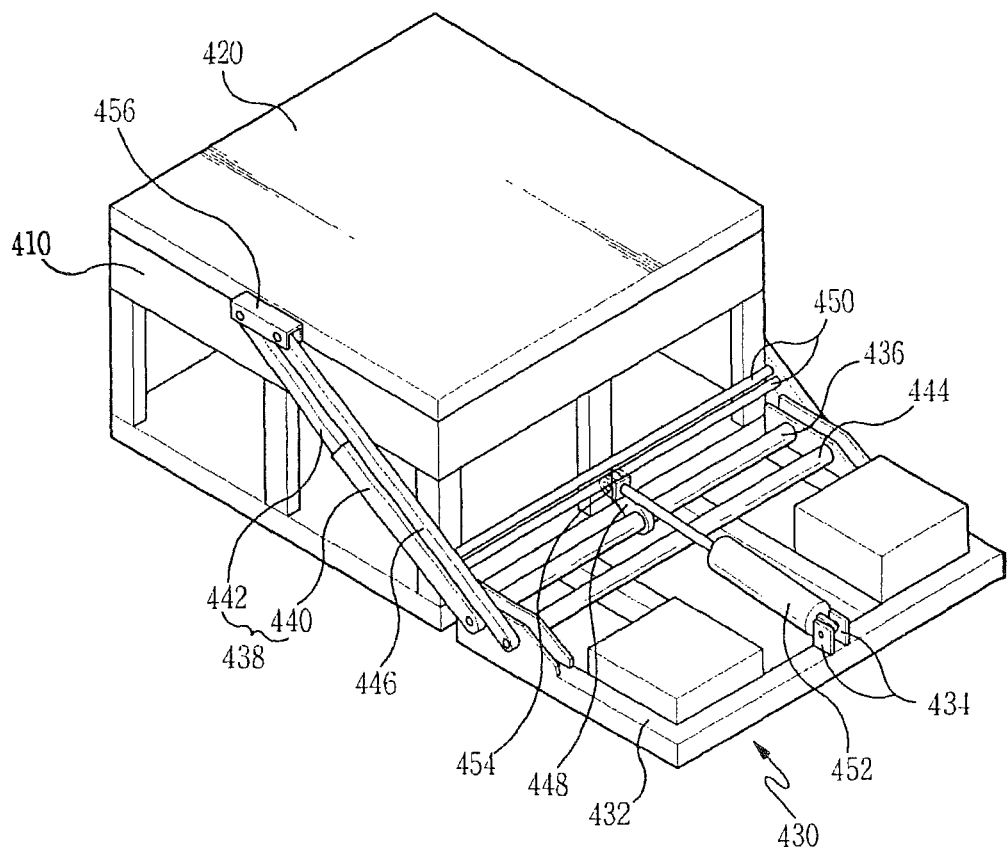
FIG. 15 is a perspective view illustrating the configuration of an upper cover opening/closing device according to a fifth embodiment of the present invention.
Figure 16A:
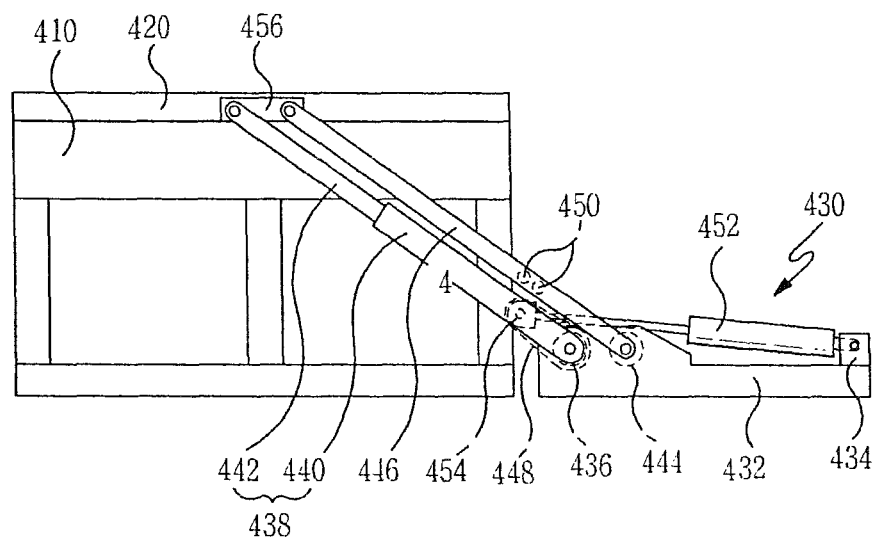
FIGS. 16A to 16E are side views illustrating the upper cover opening procedure caused by a linkage as the upper cover opening/closing device according to the fifth embodiment of the present invention.
Figure 16B:
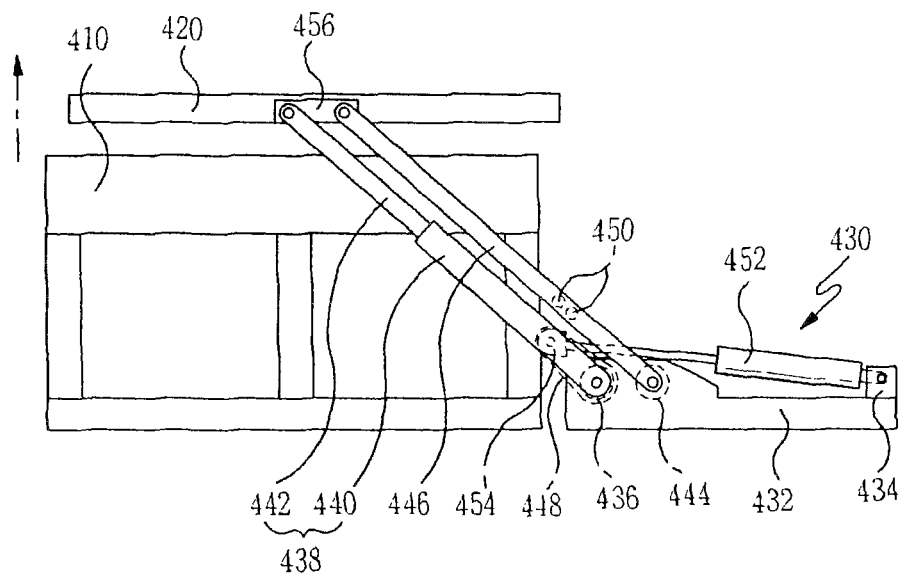
Figure 16C:
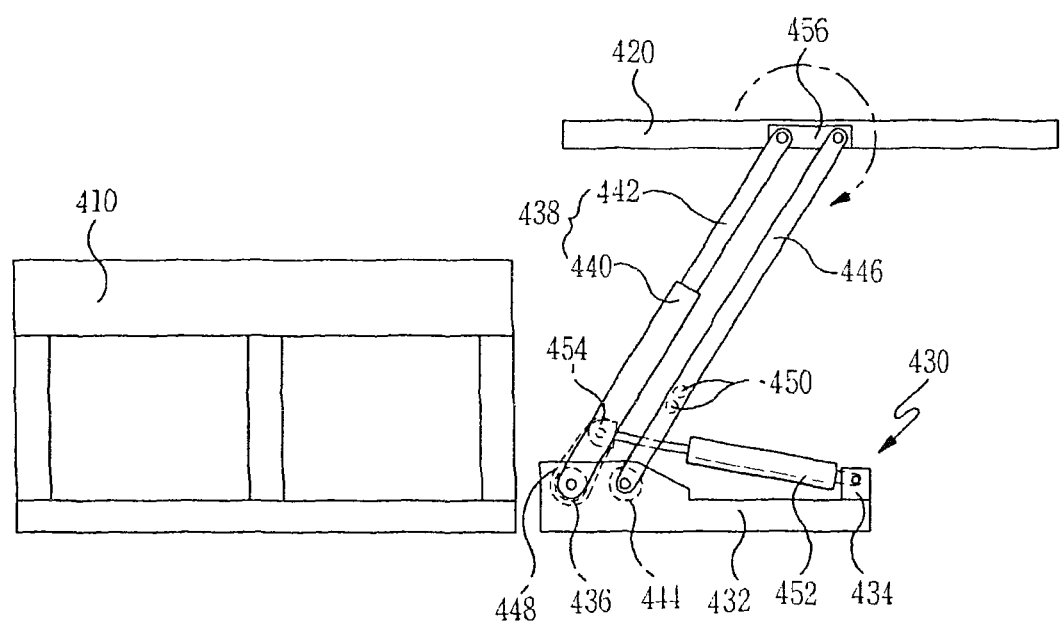
Figure 16D:
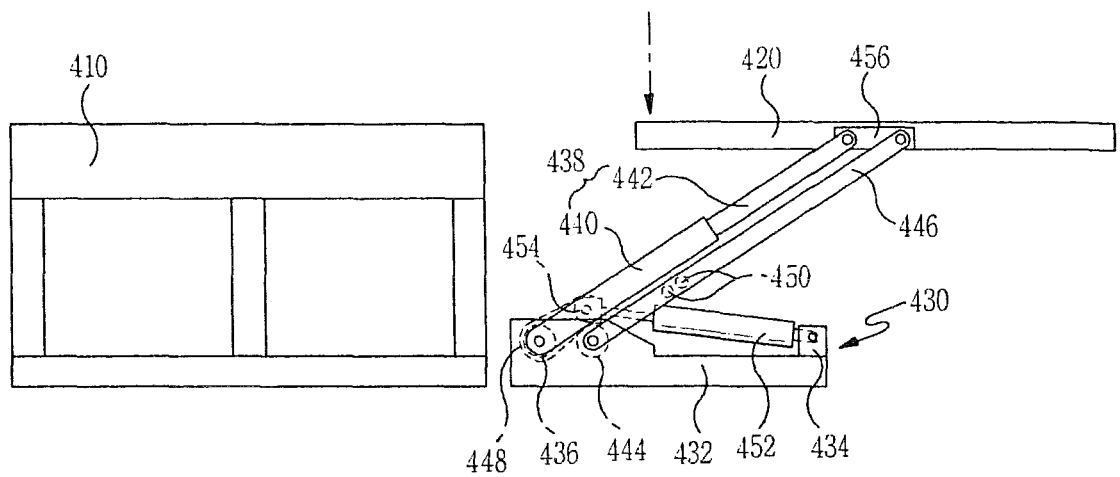
Figure 16E:
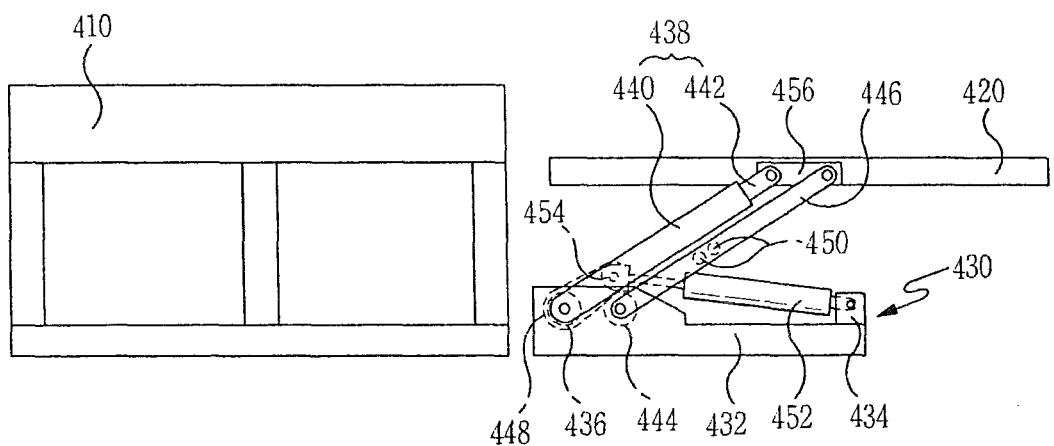

Referring to FIG. 15, an FPD manufacturing apparatus according to the present embodiment comprises: a vacuum chamber 410; an upper cover 420; and a linkage 430 as an upper cover opening/closing device. The vacuum chamber 410 is located at a proper height and is adapted to perform a desired process for a substrate positioned therein. The vacuum chamber 410 has an opening at an upper side thereof for maintenance and repair operations of equipment arranged therein. The upper cover 420 is disposed on the upper side of the vacuum chamber 410 to hermetically seal the vacuum chamber 410. The upper cover 420 serves to open or close a passage for the installation or removal of the equipment arranged in the vacuum chamber 410. The linkage 430 is arranged at a side of the vacuum chamber 410 to couple or separate the upper cover 420 to or from the vacuum chamber 410.

The linkage 430 includes: a base 432 seated on the floor; a drive shaft 436 extending between opposite inner sidewalls of the base 432; a pair of drive links 438 having lower ends fixed to opposite ends of the drive shaft 436, respectively; a follower shaft 444 extending between the inner sidewalls of the base 432 parallel to the drive shaft 436; a pair of follower links 446 having lower ends fixed to opposite ends of the follower shaft 444, respectively, to rotate in positions parallel to the drive links 438; a pair of connection links 456 to hinge upper ends of the drive links 438 to the upper cover 420, to pivotally support opposite sides of the upper cover 420; and drive means 452 having one end fixed to the drive shaft 436 and the other end fixed to the base 432 and adapted to rotate the drive shaft 436 by a proper angle.

The base 432 is a rectangular frame in which a plurality of reinforcing members crosses therethrough. The base 432 is provided, at the center of a rear end thereof opposite to the vacuum chamber 410, with a pair of upright connector plates 434, so that the other end of the drive means 452 is hinged between the connector plates 434 to freely pivot about the connector plates 434. Also, at a desired position of an upper surface of the base 432 is provided a pressure source to hydraulically or pneumatically pressure the drive means 452.

The drive shaft 436 has a horizontally extending rod shape. The drive shaft 436 is centrally provided with a triangular connector 448 having arched opposite ends, so that a piston rod of the drive means 452 is connected to the connector 448. A pair of outer sidewalls for the fixation of the drive links 438 is provided on the outside of the respective inner sidewalls that are used to fix the ends of the drive shaft 436.

Each of the drive links 438 has an elongated bar shape, and is divided into a fixed link 440 and a movable link 442. The movable link 442 is received in the fixed link 440 to be gradually extended out of the fixed link 440 according to a reciprocating movement thereof. One end of the fixed link 440 is hinged to the drive shaft 436, and the movable link 442 is hinged to an associated one of the connection links 456.

The follower shaft 444 has a horizontally extending rod shape, and is fixed to the opposite sidewalls of the base 432 to be positioned at a side of the drive shaft 436 opposite to the vacuum chamber 410. The follower links 438 are hinged to the respective outer sidewalls, which are provided on the outside of the inner sidewalls that are used to fix the ends of the follower shaft 444.

Each of the follower links 446 has an elongated contractile bar shape. The lower end of the follower link 446 is fixed to the follower shaft 444, and the upper end of the follower link 446 is hinged to an associated one of the connection links 456. The follower link 446 normally maintains a fixed length, but is selectively contracted when the upper cover 420 is lowered close to the floor. Between the follower links 446 are interposed one or more rod shaped connecting rods 450, to uniformly distribute load applied to the follower links 446 upon pivotal rotation.

The reason why the respective drive links 438 are configured so that the movable link 442 is gradually extended out of the fixed link 440 and each follower link 446 has a contractile structure is that, when the links 438 and 446 operate to rotate the upper cover 420 by 180 degrees while supporting opposite ends of the upper cover 420 and to lower the inverted upper cover 420 to a position suitable for desired maintenance and repair operations, the links 438 and 446 can be easily lowered to lower the upper cover 420.

The drive means 452 includes a hydraulically or pneumatically operable cylinder, and the piston rod received in the cylinder to be extended out of the cylinder under the influence of fluid or gas. A connector 454 is provided at one end of the piston rod, and is hinged to the connector 448 provided on the drive shaft 436 so as not to be unintentionally separated therefrom. The other end of the piston rod is hinged between the connector plates 434 that are centrally provided at the rear edge of the base 432. Thereby, One end of the drive means 452 is fixed to the drive shaft 436 and the other end is fixed to the base 432, so that the drive means 452 pivotally rotates about the connector plates 434 of the base 432 by a predetermined angle.

Alternatively, the drive means 452 may have a screw jack in place of the cylinder to pivotally rotate the drive shaft 436 by a proper angle.

Each connection link 456, to which an upper end of the movable link 442 of the drive link 438 and the upper end of the follower link 446 are hinged, is provided therein with a rotation drive unit (not shown) to provide a drive force required to rotate the upper cover 420 by a predetermined angle. The rotation drive unit (not shown) is supported by a protrusion (not shown), which extends from a lateral surface of the upper cover 420 into the connection link 456.

The upper cover 420 is opened or closed via a pivotal rotation movement of the linkage 430. With such a pivotal rotation movement, differently from the prior art wherein an upper cover is moved by a crane provided at the top of a clean room or is moved to a rotatable position in a state of being lifted by a predetermined height by use of separate equipment, the upper cover 420 is moved along a parabolic orbit under operation of the four links of the linkage 430, so that vertical lifting, horizontal movement, and inversion rotation of the upper cover 420 can be carried out via a subsequent single process.

Now, the opening/closing procedure of the upper cover carried out by the linkage 430 according to the present embodiment will be described with reference to FIGS. 16A to 16E. First, in a state wherein the upper cover 420 is mounted on the top of the vacuum chamber 410, a pressure is applied to the drive means 452 so that the piston rod of the drive means 452 is retracted into the cylinder by a desired length. The retracted piston rod pulls the connector 448, which is rotatably coupled to the drive shaft 436 while being coupled to the end of the piston rod, thereby causing the connector 448 to rotate toward the drive means 452. As a result, the connector 448 acts to rotate the drive shaft 436 toward the drive means 452.

After that, the drive links 438, coupled to opposite ends of the drive shaft 436, are rotated along with the rotating drive shaft 436, and simultaneously, the follower links 446, which are arranged at a side of the drive links 438 and are coupled to opposite ends of the follower shaft 444, are rotated. Such rotation of the links 438 and 446 causes the connection links 456, to which the upper ends of the links 438 and links 446 are hinged, to be move along a parabolic orbit.

With the use of the linkage 430 consisting of the drive links 438, follower links 446, and connection links 456, when the upper cover 420 reaches a proper position as the drive means 452 rotates the drive shaft 436 by use of the connector 448 and the retractable piston rod, the upper cover 420 can be rotated by a predetermined angle, i.e. 180 degrees, under operation of the rotation drive units provided in the connection links 456 while being supported at opposite lateral surfaces thereof by the connection links 456. Here, the proper position of the upper cover 420 is a position where the connecting rods 450 interposed between the follower links 446 do not collide with corners of the vacuum chamber 410 upon rotation of the upper cover 420.

After that, if the upper cover 420 is rotated so that a bottom surface of the upper cover 420 faces upward, the piston rod of the drive means 452 is retracted to the maximum extent, so that the drive links 438 are tilted toward the drive means 452, and simultaneously, the follower links 446 are tilted parallel to the drive links 438 toward the drive means 452 via the connection links 456. In such a tilted state, the movable links 442 are inserted into the fixed links 440, and the follower links 446 are contracted, so that the upper cover 420 is lowered to a position where an operator may conveniently perform any maintenance and repair operations while standing on the floor.

Sixth Embodiment

Figure 17:
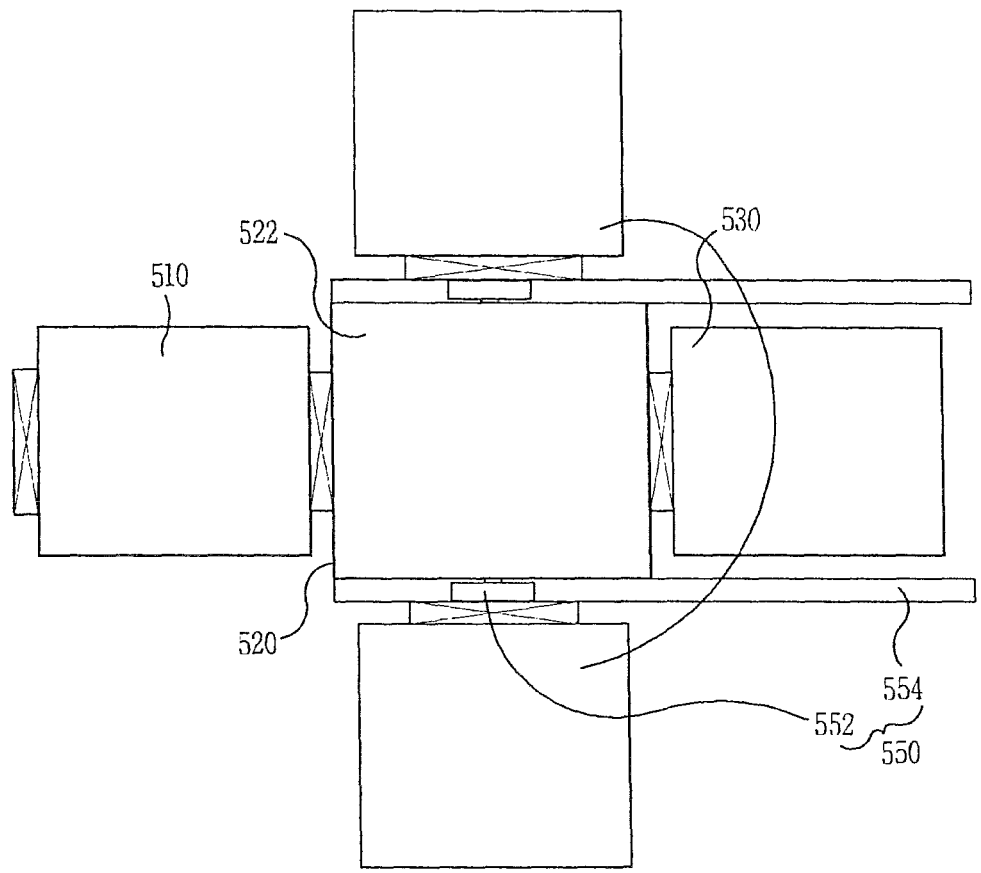
FIG. 17 is a configuration diagram schematically illustrating an FPD manufacturing apparatus according to a sixth embodiment of the present invention.

Referring to FIG. 17, an FPD manufacturing apparatus according to the present embodiment comprises: a cassette (not shown), on which a plurality of substrates (not shown), to be processed in the FPD manufacturing apparatus, is stacked; transportation means for loading the substrates stacked on the cassette into a chamber and again stacking substrates, completely processed in the FPD manufacturing apparatus, on the cassette; a load lock chamber 510; a transfer chamber 520; and a processing chamber 530. Each of the load lock chamber 510, transfer chamber 520, and processing chamber 530 has an entrance/exit port for the intercommunication of the chambers, and a gate valve is provided to open or close a respective one of the entrance/exit port. The transfer chamber 520 is provided, at an upper end thereof, with an upper cover 522 and a pair of horizontal drive units 550 each having a longitudinally extending horizontal guide 554 and a supporting unit 552.

Explaining the transfer chamber 520 in more detail, a transfer robot 540 is provided in the transfer chamber 520 to transfer a substrate to the load lock chamber 510 or processing chamber 530. A pair of the horizontal guides 554 is provided at upper locations on outer lateral wall surfaces of the transfer chamber 520 to extend in the same direction.

Figure 18:
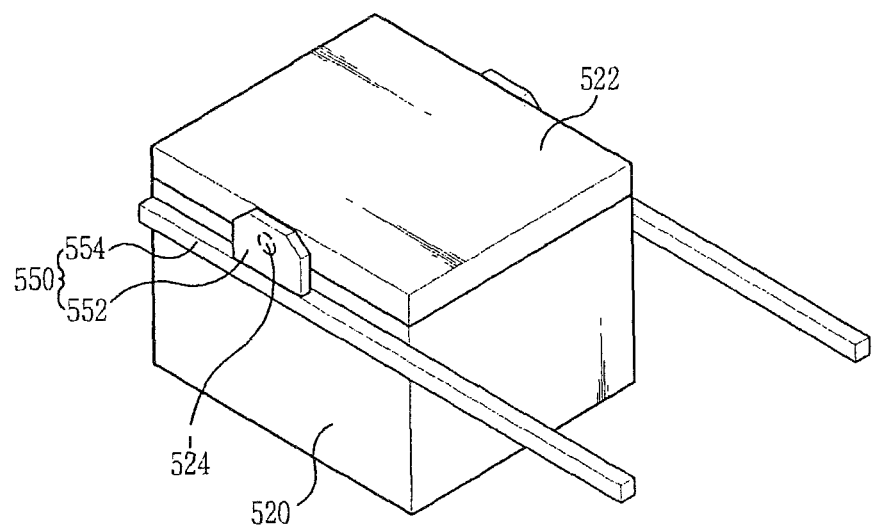
FIG. 18 is a perspective view illustrating a transfer chamber according to the sixth embodiment of the present invention.
Figure 19A:
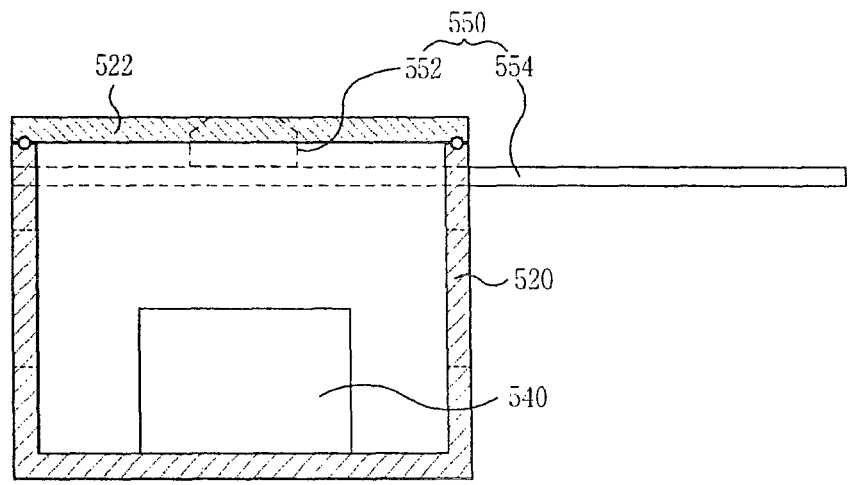
FIGS. 19A and 19B are sectional views illustrating the opening procedure of an upper cover provided at the transfer chamber of FIG. 18.
Figure 19B:
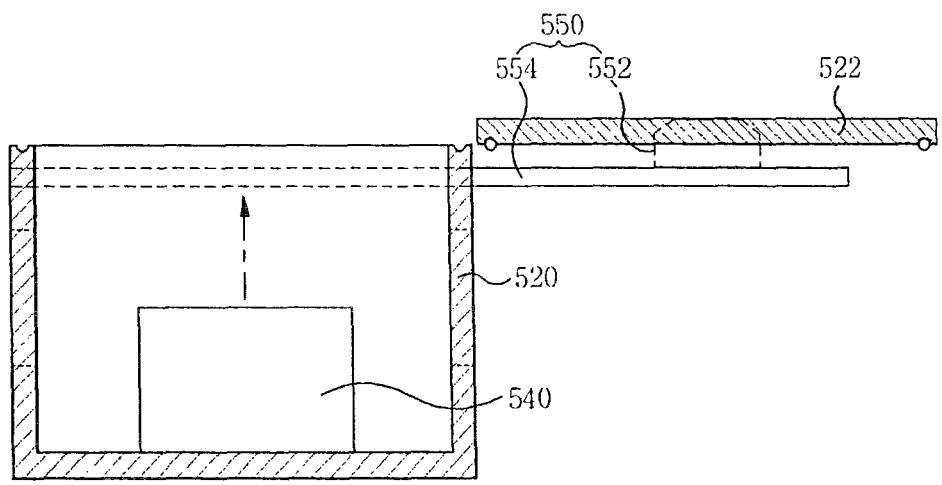

As shown in FIGS. 18, 19A and 19B, the upper cover 522 is disposed in contact with the upper end of the transfer chamber 520 to open the transfer chamber 520 when it is necessary to repair the transfer robot 540 received in the transfer chamber 520. Between coupling surfaces of the upper cover 522 and the transfer chamber 520 is provided an air-tightness member (O). In this case, at least one of the coupling surfaces of the upper cover 522 and the transfer chamber 520 is formed with an air-tightness member arrangement recess for the insertion of the air-tightness member (O).

The upper cover 522 is provided at opposite sides thereof with the supporting units 552, and protrusions 524 for the fixation of the supporting units 552. The supporting units 552 are coupled to the protrusions 524, respectively, in a horizontally movable manner.

According to an example, the horizontal guide 554 of each horizontal drive unit 550 has a square pole shape and is configured to extend toward the processing chamber 530 that is level with the transfer chamber 520. The supporting unit 552 of the horizontal drive unit 550 serves to horizontally move the upper cover 522 in a state of being in contact with an upper surface of the horizontal guide 554.

Although not shown, the horizontal guide 554 is foldable upward or outward about a middle location thereof. With such a structure, when it is unnecessary to open or close the upper cover 522 because the transfer robot 540 provided in the transfer chamber 520 requires no repair, a half section of the longitudinally extending horizontal guide 554 on the outside of the middle location can be pivotally rotated upward or outward to prevent the horizontal guide 554 from affecting operation of another chamber.

The transfer chamber 520 has to be sized to have a height and width larger than those of the processing chamber 530.

This is to prevent horizontal movement of the upper cover 522 provided at the transfer chamber 520 from being hindered by the processing chamber 530.

Now, the opening/closing procedure of the transfer chamber provided in the plasma processing apparatus according to the present embodiment will be explained with reference to FIGS. 19A and 19B.

For example, when it is necessary to move the defective transfer robot 540 provided in the transfer chamber 520 to an external repair station, first, the supporting units 552 are drive to slide on the horizontal guides 554, so that the upper cover 522, disposed in contact with the upper end of the transfer chamber 520, is pushed to move along the longitudinally extending horizontal guides 554, thereby opening the transfer chamber 520.

If the transfer chamber 520 is completely opened, the transfer robot 540 is moved to an external maintenance and repair station by use of a crane, etc. Then, the transfer robot 540 is returned to an original position inside the transfer chamber 520 after completing maintenance and repair operations, and the upper cover 522 is closed by performing the opening procedure in reverse.

In the present embodiment, when the upper cover 522 is separated from the transfer chamber 520 for the repair of the transfer robot 540, the upper cover 522 is simply horizontally moved to be positioned at a side of the transfer chamber 520, in place of being lowered to the floor by use of a crane. Thus, there is no floor space occupied by the separated upper cover 522.

Figure 20A:
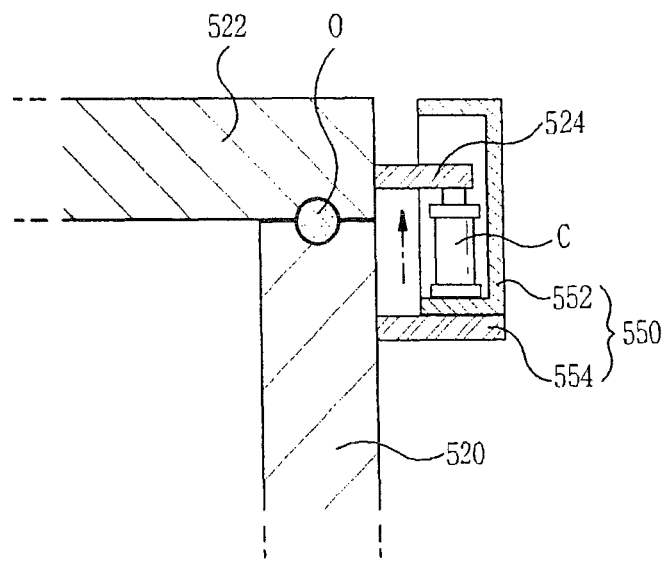
FIGS. 20A and 20B are partially enlarged views illustrating means for lifting the upper cover from the transfer chamber of FIG. 18.
Figure 20B:
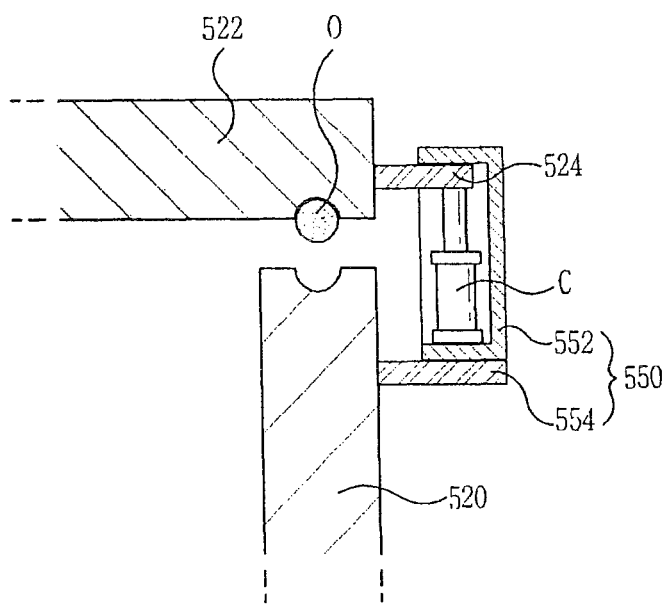

Referring to FIGS. 20A and 20B, another example of the horizontal drive unit 550 is illustrated. When the upper cover 522 is horizontally moved in a state of being contact with the upper end of the transfer chamber 520, friction is caused between the upper cover 522 and the transfer chamber 520, thereby causing damage to the air-tightness member (O), which is interposed between the coupling surfaces of the transfer chamber 520 and the upper cover 522. Thus, it is desirable that the upper cover 522 be lifted by a desired height to prevent damage to the air-tightness member (O) due to friction.

To lift the upper cover 522, a vertical drive unit (C) is affixed to the protrusion 524 underneath thereof. Here, each protrusion 524 protrudes from the center of an outer lateral wall surface of the upper cover 522, and the vertical drive unit (C) is located in the supporting unit 552 that is seated on the upper surface of the horizontal guide 554. If an external pneumatic or hydraulic pressure is applied to the vertical drive unit (C), a drive shaft of the vertical drive unit (C) pushes the protrusion 524 upward, so that the upper cover 522 having the protrusion 524 is lifted to define a gap with the transfer chamber 520.

After being lifted, the upper cover 522 is pushed to be horizontally moved by the supporting units 522 along the longitudinally extending horizontal guides 554 in the upper locations of the outer lateral wall surfaces of the transfer chamber 520. Thereby, the upper cover 522 can be horizontally moved while being spaced apart from the transfer chamber 520, thereby preventing damage to the air-tightness member (O) due to friction.

Meanwhile, each supporting unit 522, which horizontally moves in a state of rolling contact with the horizontal guide 554, is provided at a lower region thereof with a friction reduction wheel, to prevent generation of abrasion and noise upon movement thereof.

As is apparent from the above description, the present invention provides the following effects.

According to a first aspect of the present invention, there is an advantage in that it is possible to easily separate even a heavy upper cover from a vacuum chamber by use of a simple constituent element provided at the vacuum chamber without lifting the heavy upper cover. Also, the first aspect has another advantage in that opening/closing operations of the upper cover can be automatically performed in a subsequent single process under control of a control unit.

According to a second aspect of the present invention, in the case of maintenance and repair operations, an upper chamber can be opened without requiring a vertical lifting operation. This eliminates the necessity of a large-size air cylinder, achieving a simplification in the structure of a large-size FPD manufacturing apparatus and reducing manufacturing costs. Also, the opening/closing procedure of the upper chamber can be simplified, whereby a time required for the maintenance and repair of the upper chamber can be reduced.

According to a third aspect of the present invention, to rejoin an upper cover, which was separated from the top of a vacuum chamber to shift any equipment provided in the vacuum chamber to an external station, to the vacuum chamber, the upper cover is moved to a position close to the vacuum chamber and is rotated by a cover loading unit, which slides along a predetermined movement path of a track unit that is connected to the vacuum chamber. With the use of the cover loading unit and the track unit, the upper cover can be coaxially aligned with the vacuum chamber prior to being coupled. This has the effect of facilitating the coupling of the upper cover.

According to a fourth aspect of the present invention, to open an upper cover away from a vacuum chamber, an upper cover opening/closing device is coupled to the FPD manufacturing apparatus in an independently operable manner. The upper cover opening/closing device includes a base provided at a side of the vacuum chamber to be seated on the floor, two pairs of drive links and follower links connected to the base, connection links to hinge upper ends of the drive links and the follower links, and drive means to rotate the drive links in a state wherein opposite sides of the upper cover is supported by the connection links. The upper cover opening/closing device, seated on the floor, occupies only small floor space and can easily lower the large-size upper cover to a position where desired maintenance and repair operations may be easily carried out.

According to a fifth aspect of the present invention, a transfer chamber is provided at upper opposite locations thereof with horizontal guides, and an upper cover is provided at opposite sides thereof with supporting units, so that the supporting units slide on upper surfaces of the horizontal guides in a rolling contact state. With this configuration, when it is necessary to move a transfer robot positioned in the chamber to an external station, the upper cover can be easily separated from the chamber via a horizontal movement without risk of falling and without requiring a space for keeping the separated upper cover.

Also, when an air-tightness member is provided at one of contact surfaces between the transfer chamber and the upper cover, the air-tightness member may be damaged due to friction caused during horizontal movement of the upper cover. Thus, to solve damage to the air-tightness member upon opening/closing operations, the supporting units are provided with vertical drive units to lift the upper cover by a proper height.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A flat panel display (FPD) manufacturing apparatus that performs a process on a substrate under vacuum conditions, the apparatus comprising:
   a chamber, including:
      a lower chamber;
      an upper chamber movably positioned on the lower chamber so as to be opened away from or closed onto the lower chamber;
      a sealing member recess formed in a coupling surface of at least one of the upper chamber or the lower chamber;
      a sealing member received in the sealing member recess; and
      a sealing member drive unit operably coupled to the sealing member, wherein the sealing member drive unit comprises a pneumatic driver disposed in the sealing member recess, wherein the pneumatic driver is configured to be coupled to an external air pump configured to pump air into the pneumatic driver so as to inflate the pneumatic driver, and to discharge air from the pneumatic driver so as to deflate the pneumatic driver, wherein a portion of the sealing member extends out of an end of the sealing member recess when the pneumatic driver is inflated with a predetermined amount of air and the sealing member is retracted into the sealing member recess when air is discharged from the pneumatic driver.

2. The apparatus of claim 1, wherein the sealing member drive unit moves the sealing member in a vertical direction.

3. The apparatus of claim 1, wherein the sealing member drive unit is positioned in a lower portion of the sealing member recess such that the sealing member drive unit contacts a bottom surface of the sealing member to pneumatically drive the sealing member.

4. The apparatus of claim 1, wherein a width of the end of the sealing member recess at the coupling surface is less than an interior width of the sealing member recess.

5. The apparatus of claim 1, wherein the sealing member drive unit moves the sealing member within the sealing member recess so as to selectively extend a portion of the sealing member outside of the sealing member recess and fully retract the sealing member into the sealing member recess.

6. The apparatus of claim 1, further comprising a force transfer plate provided between the sealing member and the pneumatic driver so as to transfer a corresponding force to the sealing member.

7. The apparatus of claim 1, wherein the sealing member drive unit is configured to extend a portion of the sealing member out through the end of the sealing member recess when the upper chamber is positioned on the lower chamber so as to form a seal therebetween and a vacuum state in the chamber, and to fully retract the sealing member into the sealing member recess when the upper chamber is moved horizontally relative to the lower chamber.

8. The apparatus of claim 1, wherein the width of the end of the sealing member recess is less than a corresponding width of the sealing member such that the end of the sealing member recess retains a portion of the sealing member within the sealing member recess.

9. The apparatus of claim 1, wherein the coupling surface of at least one of the upper chamber or the lower chamber comprises one coupling surface provided on the upper chamber and another coupling surface provided on the lower chamber that are inclined corresponding to a movement direction of the upper chamber.

10. The apparatus of claim 1, further comprising:
a pair of horizontal drive units that support the upper chamber and move the upper chamber in a horizontal direction; and
a pair of rotating units that rotatably support the upper chamber.

* * * * *